(12) United States Patent
Song et al.

(10) Patent No.: US 11,581,311 B2
(45) Date of Patent: Feb. 14, 2023

(54) SEMICONDUCTOR DEVICE

(71) Applicant: Samsung Electronics Co., Ltd., Suwon-si (KR)

(72) Inventors: Seung Hyun Song, Hwaseong-si (KR); Yoon Suk Kim, Hwaseong-si (KR); Kyu Baik Chang, Seoul (KR); Ui Hui Kwon, Hwaseong-si (KR); Yo Han Kim, Seoul (KR); Jong Chol Kim, Seoul (KR); Chang Wook Jeong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 99 days.

(21) Appl. No.: 17/161,950

(22) Filed: Jan. 29, 2021

(65) Prior Publication Data

US 2021/0151433 A1 May 20, 2021

Related U.S. Application Data

(63) Continuation of application No. 16/908,829, filed on Jun. 23, 2020, now Pat. No. 10,950,604, which is a
(Continued)

(30) Foreign Application Priority Data

Dec. 7, 2015 (KR) .......................... 10-2015-0173134

(51) Int. Cl.
*H01L 27/088* (2006.01)
*H01L 29/78* (2006.01)
(Continued)

(52) U.S. Cl.
CPC ...... *H01L 27/0886* (2013.01); *H01L 27/0207* (2013.01); *H01L 27/0924* (2013.01);
(Continued)

(58) Field of Classification Search
CPC ............ H01L 27/0886; H01L 27/0924; H01L 29/785; H01L 27/0207; H01L 29/0649;
(Continued)

(56) References Cited

U.S. PATENT DOCUMENTS 6,476,443 B1 11/2002 Kinzer
6,716,684 B1 4/2004 Krivokapic et al.
(Continued)

OTHER PUBLICATIONS

"Semiconductor Device" Specification, Drawings and Prosecution History of U.S. Appl. No. 15/370,463, filed Dec. 6, 2016, now U.S. Pat. No. 10,504,894, issued Dec. 10, 2019, by Seung Hyun Song, et al.

(Continued)

*Primary Examiner* — Shahed Ahmed
*Assistant Examiner* — Sun Mi Kim King
(74) *Attorney, Agent, or Firm* — Onello & Mello, LLP

(57) ABSTRACT

A semiconductor device includes a fin-type pattern extending in a first direction, a device isolation film surrounding the fin-type pattern, while exposing an upper portion of the fin-type pattern, a gate electrode extending on the device isolation film and the fin-type pattern in a second direction intersecting the first direction, a gate isolation film isolating the gate electrode in the second direction, and including a first material and on the device isolation film, an interlayer insulating film filling a side surface of the fin-type pattern and including a second material different from the first material.

20 Claims, 18 Drawing Sheets

Related U.S. Application Data continuation of application No. 16/671,478, filed on Nov. 1, 2019, now Pat. No. 10,714,473, which is a continuation of application No. 15/370,463, filed on Dec. 6, 2016, now Pat. No. 10,504,894.

(51) Int. Cl.

| | | |
|---|---|---|
| *H01L 27/02* | (2006.01) | |
| *H01L 29/06* | (2006.01) | |
| *H01L 27/092* | (2006.01) | |
| *H01L 21/8238* | (2006.01) | |
| *H01L 21/8234* | (2006.01) | |

(52) U.S. Cl.
CPC ........ H01L 29/0649 (2013.01); H01L 29/785 (2013.01); *H01L 21/823431* (2013.01); *H01L 21/823437* (2013.01); *H01L 21/823481* (2013.01); *H01L 21/823821* (2013.01); *H01L 21/823828* (2013.01); *H01L 21/823878* (2013.01)

(58) Field of Classification Search
CPC ..... H01L 21/823821; H01L 21/823878; H01L 21/823437; H01L 21/823481; H01L 21/823828; H01L 21/823431; H01L 29/7854; H01L 29/42356; H01L 29/7855
See application file for complete search history.

(56) References Cited

U.S. PATENT DOCUMENTS

| | | |
|---|---|---|
| 7,049,197 B2 | 5/2006 | Jang et al. |
| 7,482,670 B2 | 1/2009 | Curello et al. |
| 8,492,206 B2 | 7/2013 | Zhong et al. |
| 8,987,128 B2 | 3/2015 | Rashed et al. |
| 9,219,153 B2 | 12/2015 | Xie et al. |
| 9,397,007 B2 | 7/2016 | Zhong et al. |
| 9,608,086 B2 | 3/2017 | Wei et al. |
| 9,679,978 B2 | 6/2017 | Kim et al. |
| 2012/0025317 A1 | 2/2012 | Zhong et al. |
| 2013/0200449 A1 | 8/2013 | Chen |
| 2015/0054078 A1 | 2/2015 | Xie et al. |
| 2015/0332973 A1 | 11/2015 | Zhong et al. |
| 2015/0340461 A1 | 11/2015 | Wei et al. |
| 2017/0092728 A1 | 3/2017 | Kim et al. |
| 2017/0358585 A1 | 12/2017 | Lim et al. |

OTHER PUBLICATIONS

"Semiconductor Device" Specification, Drawings and Prosecution History of United States U.S. Appl. No. 16/671,478, filed Nov. 1, 2019, now U.S. Pat. No. 10,714,473, issued Jul. 14, 2020, by Seung Hyun Song, et al.

"Semiconductor Device" Specification, Drawings and Prosecution History of United States U.S. Appl. No. 16/908,829, filed Jun. 23, 2020, by Seung Hyun Song, et al.

SEMICONDUCTOR DEVICE

CROSS-REFERENCE TO RELATED APPLICATIONS

This application is a continuation application of U.S. application Ser. No. 16/908,829, filed Jun. 23, 2020, which is a continuation application of U.S. application Ser. No. 16/671,478, filed Nov. 1, 2019, now U.S. Pat. No. 10,714,473, issued Jul. 14, 2020, which is a continuation application of U.S. application Ser. No. 15/370,463, filed Dec. 6, 2016, now U.S. Pat. No. 10,504,894, issued Dec. 10, 2019, which claims priority under 35 USC § 119 to Korean Patent Application No. 10-2015-0173134, filed on Dec. 7, 2015 in the Korean Intellectual Property Office, the contents of which are herein incorporated by reference in their entirety.

BACKGROUND

1. Technical Field

Some embodiments of the present inventive concepts relate to a semiconductor device.

2. Description of the Related Art

A multigate transistor has been suggested as one of the scaling technologies to increase the density of semiconductor devices. In the multigate transistor a silicon body in a fin or nanowire shape is formed on a substrate with gates being formed on a surface of the silicon body.

Such multigate transistors allow easy scaling due to the use of a three-dimensional channel. Further, current control capability of the multigate transistor may be enhanced without requiring an increased gate length of the multigate transistor. Furthermore, using the multigate transistor effectively suppresses short channel effect (SCE) which is the phenomenon in which the electric potential of a channel region is influenced by a drain voltage.

SUMMARY

According to some embodiments of the present inventive concepts, there is provided a semiconductor device using an isolation film for cutting a gate electrode which results in enhanced performance.

According to an aspect of the present inventive concepts, there is provided a semiconductor device, comprising a fin-type pattern extending in a first direction, a device isolation film surrounding the fin-type pattern, while exposing an upper portion of the fin-type pattern, a gate electrode extending on the device isolation film and the fin-type pattern in a second direction intersecting the first direction, a gate isolation film isolating the gate electrode in the second direction, and comprising a first material and on the device isolation film, an interlayer insulating film filling a side surface of the fin-type pattern and comprising a second material different from the first material.

In some embodiments, the semiconductor device further includes a second trench between the fin-type pattern and the first gate isolation film and a third gate isolation film is in the second trench.

According to another aspect of the present inventive concepts, there is provided a semiconductor device, comprising a first gate electrode extending in a first direction, a first gate isolation film isolating the first gate electrode, and extending in a second direction intersecting the first direction, a second gate isolation film isolating the first gate electrode, extending in the second direction, and being spaced apart from the first gate isolation film in the first direction, a first active region formed between the first and second gate isolation films and a third gate isolation film formed between the first active region and the first gate isolation film, wherein no active region is formed between the first and third gate isolation films.

According to another aspect of the present inventive concepts, there is provided a semiconductor device, comprising first and second gate electrodes extending in parallel with each other in a first direction, and being spaced apart from each other in a second direction intersecting the first direction, a first gate isolation film extending in the second direction, isolating the first gate electrode in the first direction, and isolating the second gate electrode in the first direction, a second gate isolation film extending in the second direction, isolating the first gate electrode in the first direction, isolating the second gate electrode in the first direction, and being spaced apart from the first gate isolation film in the first direction, a third gate isolation film extending in the second direction, isolating the first gate electrode in the first direction, and being formed between the first and second gate isolation films and a fourth gate isolation film extending in the second direction, isolating the second gate electrode in the first direction, being formed between the first and second gate isolation films, and being spaced apart from the third gate isolation film.

In some embodiments, the semiconductor device further includes a third gate electrode extending in the first direction in parallel with the first and second gate electrodes, and being spaced apart from the first and second gate electrodes in the second direction, and a fifth gate isolation film extending in the second direction, isolating the third gate electrode in the first direction, and being formed between the first and second gate isolation films.

According to another aspect of the present inventive concepts, there is provided a semiconductor device, comprising a first gate electrode extending in a first direction, a first interlayer insulating film surrounding a side surface of the first gate electrode, a first trench isolating the first gate electrode and the first interlayer insulating film, and extending in a second direction intersecting the first direction, a first isolation film filling the first trench, a second trench isolating the first gate electrode and the first interlayer insulating film, extending in the second direction, and being spaced apart from the first trench in the first direction, a second isolation film filling the second trench, a first active region formed between the first and second gate isolation films, a third trench formed between the first and second gate isolation films, and extending in the second direction and a third isolation film filling the third trench.

According to another aspect of the present inventive concepts, there is provided a semiconductor device including a plurality of gate electrodes extending in a first direction, a first gate isolation film isolating portions of at least one of the plurality of gate electrodes, and extending in a second direction intersecting the first direction, a second gate isolation film isolating portions of at least one of the plurality of gate electrodes, extending in the second direction, and being spaced apart from the first gate isolation film in the first direction, a first active region between the first and second gate isolation films, and a third gate isolation film between the first active region and the first gate isolation film and isolating at least one of the plurality of gate electrodes. The third gate isolation film overlaps the first gate isolation film in the first direction and is spaced apart from the second gate isolation film in the second direction.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION

A semiconductor device according to some example embodiments will be described with reference to FIGS. 1 to 8.

Figure 1:
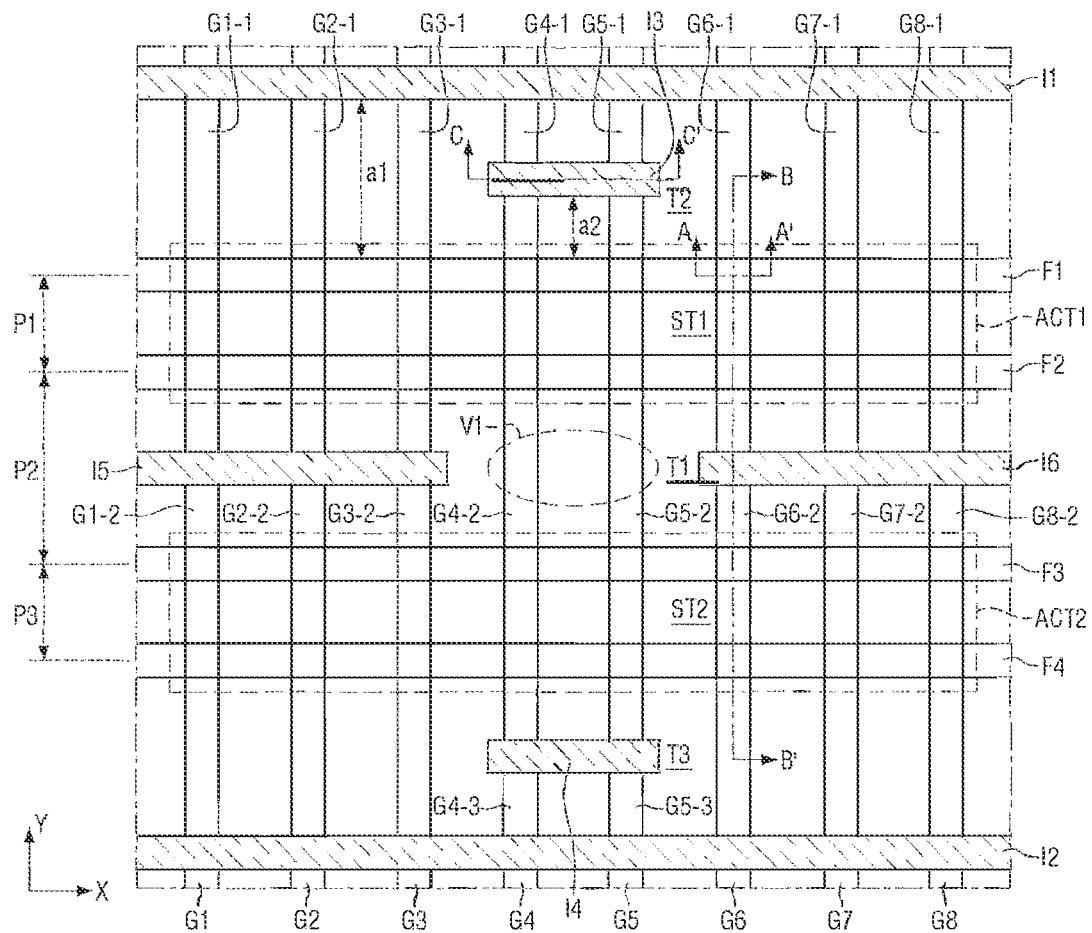
FIG. 1 is a layout diagram illustrating a semiconductor device according to some example embodiments of the present inventive concepts.
Figure 2:
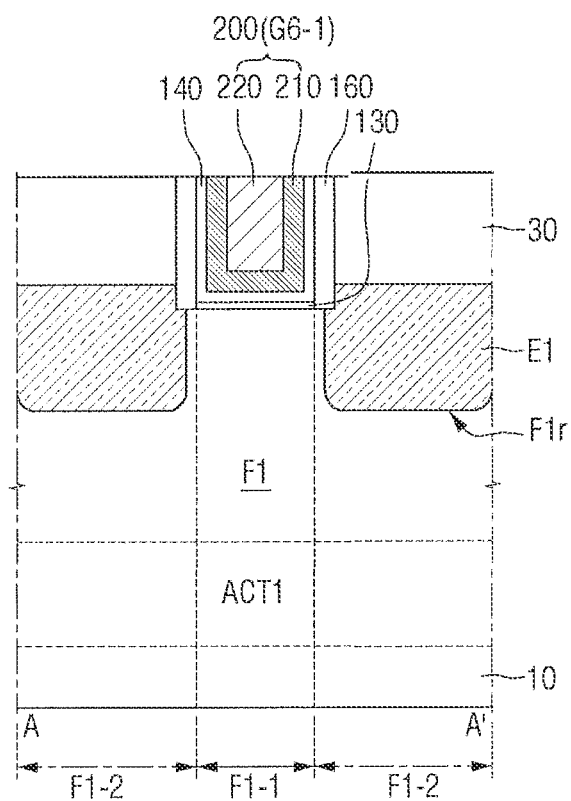
FIG. 2 is a cross-sectional view taken along line A-A' of FIG. 1.
Figure 3:
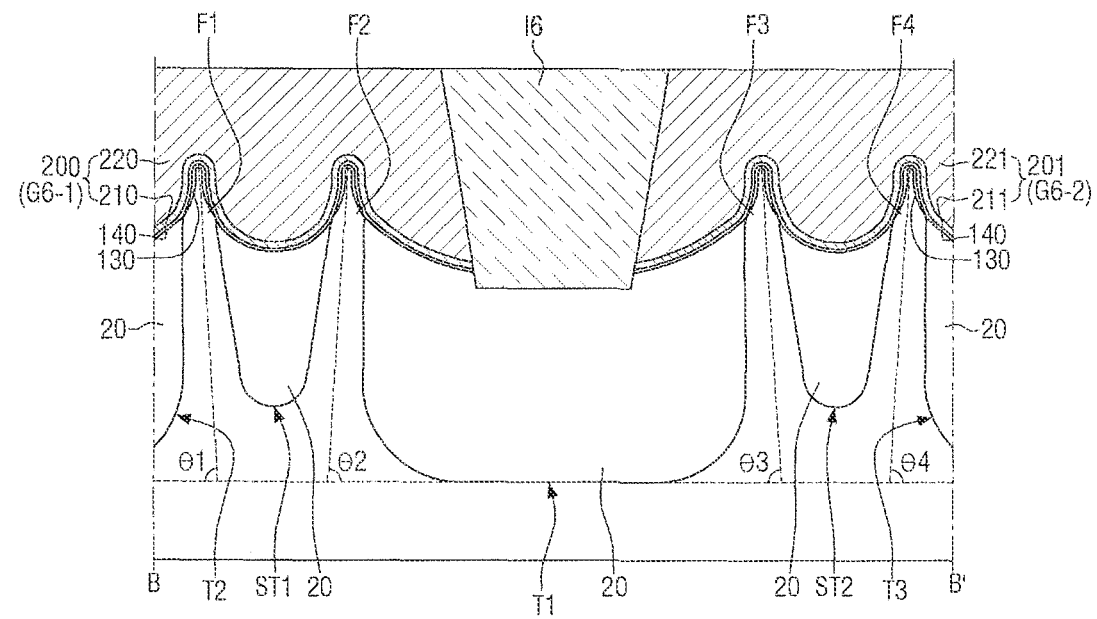
FIG. 3 is a cross-sectional view taken along line B-B' of FIG. 1.
Figure 4:
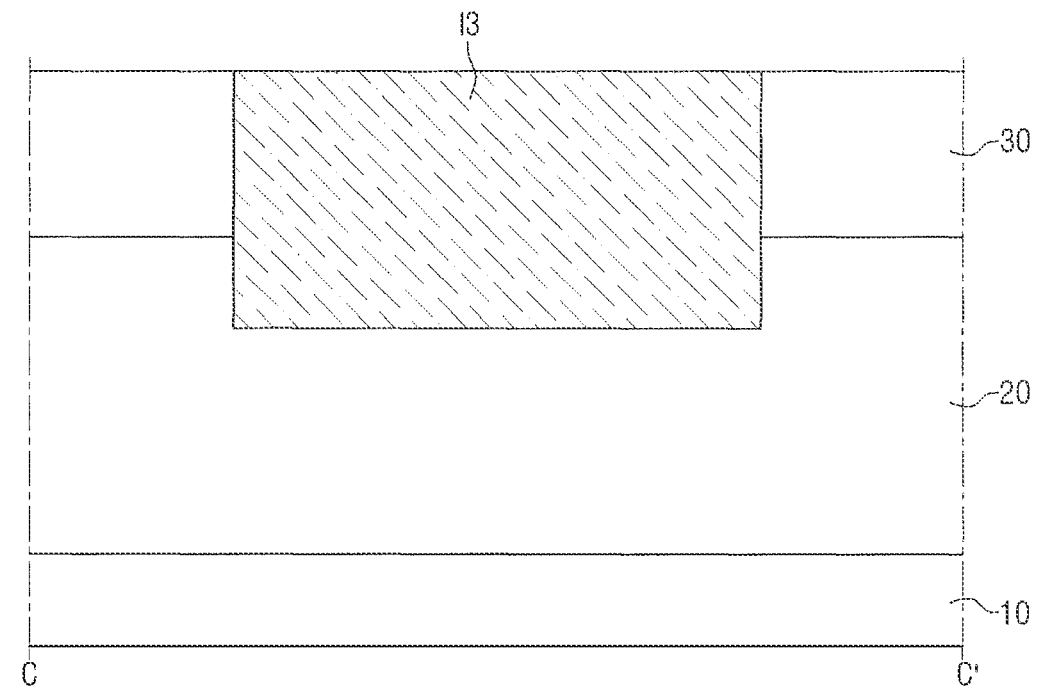
FIG. 4 is a cross-sectional view taken along line C-C' of FIG. 1.

FIG. 1 is a layout diagram illustrating a semiconductor device according to some example embodiments of the present inventive concepts. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1.

Referring to FIGS. 1 to 4, a semiconductor device according to some example embodiments may include a substrate 10, first to fourth fin-type patterns F1-F4, first and second shallow trenches ST1, ST2, first to third trenches T1-T3, a device isolation film, that is, a first interlayer insulating film 20, a second interlayer insulating film 30, first to eighth gate electrodes G1-G8, first and second gate insulating films 130 and 140, a gate spacer 160, a source/drain E1, and first to sixth isolation film patterns I1-I6.

The substrate 10 may be, for example, a bulk silicon or a silicon-on-insulator (SOI). The substrate 10 may be, for example, a silicon substrate, or may include, for example, other substances such as silicon germanium, indium antimonide, lead telluride compound, indium arsenide, indium phosphide, gallium arsenide, or gallium antimonide. The substrate 10 may be, for example, a base substrate having an epitaxial layer formed thereon.

The first to fourth fin-type patterns F1-F4 may extend longitudinally in a first direction X. The first to fourth fin-type patterns F1-F4 have a length extending in the first direction X which is greater than a width of the first to fourth fin-type patterns extending in a second direction Y. As illustrated in FIG. 1, the first to fourth fin-type patterns F1-F4 may have a rectangular shape, although example embodiments are not limited thereto. When the first to fourth fin-type patterns F1-F4 have a rectangular shape, the first to fourth fin-type patterns F1-F4 may include long sides extending in the first direction X and short sides extending in a second direction Y. In such an embodiment, the second direction Y is not in parallel with the first direction X, but, rather, intersects the first direction X. The second direction Y is substantially perpendicular to the first direction X.

The first to fourth fin-type patterns F1-F4 may be spaced apart from one another in the second direction Y. In such an embodiment, the first fin-type pattern F1 and the second fin-type pattern F2 may be spaced apart by a first pitch P1. The second fin-type pattern F2 and the third fin-type pattern F3 may be spaced apart by a second pitch P2. The third fin-type pattern F3 and the fourth fin-type pattern F4 may be spaced apart by a third pitch P3.

The first pitch P1 and the third pitch P3 may be narrower than the second pitch P2. That is, the pitch P2 between the second fin-type pattern F2 and the third fin-type pattern F3 may be formed wider than the pitches, for example pitches P1 and P3, between other fin-type patterns.

The first and second fin-type patterns F1, F2 may be defined by the first shallow trench ST1. The first shallow trench ST1 may be formed between the first fin-type pattern F1 and the second fin-type pattern F2. The third and fourth fin-type patterns F3, F4 may be defined by the second shallow trench ST2. The second shallow trench ST2 may be formed between the third fin-type pattern F3 and the fourth fin-type pattern F4. The first fin-type pattern F1 may be formed between the second trench T2 and the first shallow trench ST1. The second fin-type pattern F2 may be formed between the first shallow trench ST1 and the first trench T1. The third fin-type pattern F3 may be formed between the first trench T1 and the second shallow trench ST2. The fourth fin-type pattern F4 may be formed between the second shallow trench ST2 and the third trench T3. That is, the first and second fin-type patterns F1, F2 are defined by the first trench T1, the second trench T2, and the first shallow trench ST1, and the third and fourth fin-type patterns F3, F4 are defined by the first trench T1, the third trench T3, and the second shallow trench ST2.

Depths of the first and second shallow trenches ST1, ST2 may be equal to or less than depths of the first to third trenches T1-T3. Further, widths of the first and second shallow trenches ST1, ST2 may be less than widths of the first to third trenches T1-T3. Accordingly, a volume of the device isolation film, that is, first interlayer insulating film 20 formed in the first to third trenches T1-T3 may be greater than a volume of the first interlayer insulating film 20 formed in the first and second shallow trenches ST1, ST2.

The first fin-type pattern F1 and the second fin-type pattern F2 may be spaced apart from each other by the first shallow trench ST1. The second fin-type pattern F2 and the third fin-type pattern F3 may be spaced apart by the first trench T1. The third fin-type pattern F3 and the fourth fin-type pattern F4 may be spaced apart by the second shallow trench ST2.

The first shallow trench ST1 may be formed on a side surface of the first fin-type pattern F1 facing the second fin-type pattern F2. The second trench T2 may be formed on a side surface of the first fin-type pattern F1 opposite to the side surface on which the first shallow trench ST1 is formed. The second shallow trench ST2 may be formed on a side surface of the third fin-type pattern F3 facing the fourth fin-type pattern F4 and a side surface of the fourth fin-type pattern F4 facing the third fin-type pattern F3. The third trench T3 may be formed on a side surface of the fourth fin-type pattern F4 not in contact with the second shallow trench ST2, that is, a side surface opposite to the side surface on which the second shallow trench ST2 is formed. The first trench T1 may be formed on a side surface of the second fin-type pattern F2 facing the third fin-type pattern F3 and on a side surface of the third fin-type pattern F3 facing the second fin-type pattern F2.

The first to fourth fin-type patterns F1-F4 may be formed by, for example, etching a portion of the substrate 10, and may include, for example, an epitaxial layer grown from the substrate 10. The first to fourth fin-type patterns F1-F4 may include, for example, an elemental semiconductor material such as silicon or germanium. Further, the first to fourth fin-type patterns F1-F4 may include, for example, a compound semiconductor such as IV-IV group compound semiconductor or III-V group compound semiconductor.

In the embodiment in which the first to fourth fin-type patterns include the IV-IV group compound semiconductor, the first to fourth fin-type patterns F1-F4 may be, for example, a binary compound or a ternary compound including at least two or more of carbon (C), silicon (Si), germanium (Ge) and tin (Sn), or these compounds doped with IV group element.

In the embodiment in which the first to fourth fin-type patterns include the III-V group compound semiconductor, the first to fourth fin-type patterns F1-F4 may be, for example, a binary compound, a ternary compound or a quaternary compound formed by combining a III group element which may be at least one of aluminum (Al), gallium (Ga), and indium (In), with a V group element which may be one of phosphorus (P), arsenic (As), and antimony (Sb).

In the semiconductor device according to some example embodiments, it is assumed that the first to fourth fin-type patterns F1-F4 include silicon.

The first interlayer insulating film 20 may fill a portion of the first to third trenches T1-T3 and the first and second shallow trenches ST1, ST2. The first interlayer insulating film 20 may surround a portion of side surfaces of the first to fourth fin-type patterns F1-F4. The first to fourth fin-type patterns F1-F4 may protrude upward further than the upper surface of the first interlayer insulating film 20.

For example, the first interlayer insulating film 20 may include at least one of silicon oxide, silicon nitride, silicon oxynitride, and a low-k dielectric material with a smaller dielectric constant than silicon oxide. For example, the low-k dielectric material may include flowable oxide (FOX), Tonen silazen (TOSZ), undoped silica glass (USG), borosilicate glass (BSG), phosphosilicate glass (PSG), borophosphosilicate glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof; however, the present inventive concepts are not limited thereto.

The first interlayer insulating film 20 may have a specific stress characteristic. That is, the first interlayer insulating film 20 may have a tensile stress characteristic as the volume of the first interlayer insulating film 20 is shrunk by a heat process after deposition. Slopes of sidewalls of the first to fourth fin-type patterns F1-F4 may be determined by the tensile stress characteristic of the first interlayer insulating film 20 according to a volume of the first interlayer insulating film 20. That is, when the volume of the first interlayer insulating film 20 is different on both side surfaces of the fin-type pattern, the slope of the fin-type pattern may increase as the difference of the volume increases. This is because a result of the shrink rate of the first interlayer insulating film 20 of a larger volume being smaller than the shrink rate of the first interlayer insulating film 20 of a smaller volume.

Specifically, the sidewalls of the first to fourth fin-type patterns F1-F4 may be inclined in directions extending towards the first trench T1, the second trench T2, and the third trench T3, respectively.

That is, the sidewalls of the first fin-type pattern F1 may be inclined in a direction extending towards the second trench T2, the sidewalls of the second fin-type pattern F2 and the third fin-type pattern F3 may be inclined in a direction extending towards the first trench T1, and the sidewalls of the fourth fin-type pattern F4 may be inclined in a direction extending towards the third trench T3.

That is, a rising angle of the first fin-type pattern F1 in the direction of the second trench T2 direction is a first angle $\theta 1$, rising angles of the second fin-type pattern F2 and the third fin-type pattern F3 in the direction of the first trench T1 are a second angle $\theta 2$ and a third angle $\theta 3$, respectively, and a rising angle of the fourth fin-type pattern F4 in the direction of the third trench T3 is a fourth angle $\theta 4$. The first to fourth angles $\theta 1$-$\theta 4$ may be acute angles. That is, the first fin-type pattern F1, the second fin-type pattern F2, the third fin-type pattern F3, and the fourth fin-type pattern F4 may be inclined.

However, example embodiments are not limited thereto, and accordingly, the first to fourth fin-type patterns F1-F4 may not be inclined, but formed in a vertical direction, that is, in a substantially vertical direction of extension relative to a horizontal direction of extension of the substrate 10.

A first active region ACT1 may include the first fin-type pattern F1 and the second fin-type pattern F2. The first active region ACT1 may include the first shallow trench ST1, a portion of the second trench T2, and a portion of the first trench T1.

A second active region ACT2 may include the third fin-type pattern F3 and the fourth fin-type pattern F4. The second active region ACT2 may include the second shallow trench ST2, a portion of the first trench T1, and a portion of the third trench T3.

The first active region ACT1 and the second active region ACT2 may be spaced apart from each other in the second direction Y. The first active region ACT1 and the second active region ACT2 may be spaced apart from each other by a portion of the first trench T1. In this embodiment, the first active region ACT1 and the second active region ACT2 may have different conductivity types from each other. That is, the transistors in the first active region ACT1 and the second active region ACT2 may have different conductivity types from each other. Specifically, the first active region ACT1 and the second active region ACT2 may include an N-type transistor and a P-type transistor, respectively. However, example embodiments are not limited to the examples provided above.

The first to eighth gate electrodes G1-G8 may extend in the second direction Y. The first to eighth gate electrodes G1-G8 may be spaced apart from one another in the first direction X. In this case, the pitches between the first to eighth gate electrodes G1-G8 may be constant. However, example embodiments are not limited to the example given above.

The first to eighth gate electrodes G1-G8 may include regions, respectively, isolated by the first to sixth isolation film patterns I1-I6. Specifically, the first gate electrode G1 may include a first region G1-1 and a second region G1-2 isolated by the fifth isolation film pattern I5. That is, the first region G1-1 is spaced apart from the second region G1-2 by the fifth isolation film pattern I5. The second gate electrode G2 may include a first region G2-1 and a second region G2-2 isolated by the fifth isolation film pattern I5. That is, the first region G2-1 is spaced apart from the second region G2-2 by the fifth isolation film pattern I5. The third gate electrode G3 may include a first region G3-1 and a second region G3-2 isolated by the fifth isolation film pattern I5. That is, the first region G3-1 is spaced apart from the second region G3-2 by the fifth isolation film pattern I5.

The fourth gate electrode G4 may include a first region G4-1, a second region G4-2, and a third region G4-3 isolated by the third isolation film pattern I3 and the fourth isolation film pattern I4. That is, the third isolation film pattern I3 may isolate the first region G4-1 and the second region G4-2, and the fourth isolation film pattern I4 may isolate the second region G4-2 and the third region G4-3. That is the first region G4-1 may be spaced apart from the second region G4-2 by the third isolation film pattern I3 and the second region G4-2 may be spaced apart from the third region G4-3 by the fourth isolation film pattern I4.

The fifth gate electrode G5 may include a first region G5-1, a second region G5-2, and a third region G5-3 isolated by the third isolation film pattern I3 and the fourth isolation film pattern I4. That is, the third isolation film pattern I3 may isolate the first region G5-1 and the second region G5-2, and the fourth isolation film pattern I4 may isolate the second region G5-2 and the third region G5-3. That is the first region G5-1 may be spaced apart from the second region G5-2 by the third isolation film pattern I3 and the second region G5-2 may be spaced apart from the third region G5-3 by the fourth isolation film pattern I4.

The sixth gate electrode G6 may include a first region G6-1 and a second region G6-2 isolated by the sixth isolation film pattern I6. That is, the first region G6-1 is spaced apart from the second region G6-2 by the sixth isolation film pattern I6. The seventh gate electrode G7 may include a first region G7-1 and a second region G7-2 isolated by the sixth isolation film pattern I6. That is, the first region G7-1 is spaced apart from the second region G7-2 by the sixth isolation film pattern I6. The eight gate electrode G8 may include a first region G8-1 and a second region G8-2 isolated by the sixth isolation film pattern I6. That is, the first region G8-1 is spaced apart from the second region G8-2 by the sixth isolation film pattern I6.

The respective isolated regions, that is, the regions isolated by isolation film patterns I3, I4, I5 and I6, may be entirely physically isolated from one another. However, note that such isolation refers to separation from one another on a same vertical level, and it does not foreclose electric connection with one another by an additional structure on another level.

The first to eighth gate electrodes G1-G8 may intersect the first to fourth fin-type patterns F1-F4, respectively. That is, each of the first to eighth gate electrodes G1-G8 may include a portion overlapping with each of the first to fourth fin-type patterns F1-F4 which are spaced apart from one another. The first to fourth fin-type patterns F1-F4 may include portions overlapping with, and portions non-overlapping with the first to eighth gate electrodes G1-G8, respectively.

Referring to FIGS. 1 and 2, for example, the first fin-type pattern F1 may include a first portion F1-1 overlapping with the sixth gate electrode G6, and a second portion F1-2 non-overlapping with the sixth gate electrode G6. The second portion F1-2 of the first fin-type pattern F1 may be disposed on opposite sides in the first direction X with reference to the first portion F1-1 of the first fin-type pattern F1 as a center. That is, the second portions F1-2 are disposed along the first fin-type pattern F1 between adjacent gate electrodes in the first direction X. Like the first fin-type pattern F1, the second to fourth fin-type patterns F2-F4 may overlap with the sixth gate electrode G6. Likewise, the first to third gate electrodes G1-G3, and the fifth to eighth gate electrodes G5-G8 may overlap with the first to fourth fin-type patterns F1-F4.

Example embodiments will be described with reference to FIGS. 2 and 3. A first region 200 and a second region 201 of the gate electrodes 200, 201 in FIGS. 2 and 3 refer to the first region G6-1 and the second region G6-2 of the sixth gate electrode G6 in FIG. 1, respectively. For convenience of explanation, the reference numerals will be mentioned together. In some example embodiments, the first to fifth gate electrodes G1-G5 and the seventh to eighth gate electrodes G7-G8 may all have the same shape in the second direction (Y) cross-sections, and the cross-section taken along the sixth gate electrode G6 will be described for example.

Referring to FIGS. 2 and 3, the first region 200, G6-1 of the sixth gate electrode G6 may include a first work function metal 210 and a first fill metal 220. The first work function metal 210 is capable of adjusting a work function, and the first fill metal 220 fills the space formed by the first work function metal 210. The first work function metal 210 may be, for example, an N-type work function metal, a P-type work function metal, or a combination thereof.

In some exemplary embodiments, the first active region ACT1 that includes the first region 200, G6-1 of the sixth gate electrode may be an N-type active region, in such an embodiment, the first work function metal 210 may be an N-type work function metal. For example, the first work function metal 210 may include at least one of, for example, TiN, WN, TiAl, TiAlN, TaN, TiC, TaC, TaCN, TaSiN, or a combination thereof; however, the present inventive concepts are not limited thereto. Further, the first fill metal 220 may include at least one of, for example, W, Al, Cu, Co, Ti, Ta, poly-Si, SiGe, or a metal alloy; however, the present inventive concepts are not limited thereto.

The second region 201, G6-2 of the sixth gate electrode G6 may include a second work function metal 211 and a second fill metal 221. The second work function metal 211 is capable of adjusting a work function, and the second fill metal 221 fills the space formed by the second work function metal 211. The second work function metal 211 may be, for example, an N-type work function metal, a P-type work function metal, or a combination thereof.

In some example embodiments, the second active region ACT2 that includes the second region 201, G6-2 of the sixth gate electrode may be a P-type active region. In such an embodiment, the second work function metal 211 may be a combination of an N-type work function metal and a P-type work function metal. For example, the second work function metal 211 may include at least one of, for example, TiN, WN, TiAl, TiAlN, TaN, TiC, TaC, TaCN, TaSiN, or a combination thereof; however, the present inventive concepts are not limited thereto. Further, the second fill metal 221 may include at least one of, for example, W, Al, Cu, Co, Ti, Ta, poly-Si, SiGe, or a metal alloy; however, the present inventive concepts are not limited thereto.

For example, the first region 200, G6-1, and the second region 201, G6-2 of the sixth gate electrode G6 may be formed by using a replacement process or a gate last process; however, the present inventive concepts are not limited thereto.

The gate insulating films 130 and 140 may include an interfacial film 130 and a high-k dielectric film 140. The interfacial film 130 and the high-k dielectric film 140 may be formed between the first to fourth fin-type patterns F1-F4 and the first region 200, G6-1 of the sixth gate electrode G6 and between the first to fourth fin-type patterns F1-F4 and the second region 201, G6-2 of the sixth gate electrode G6. The high-k dielectric film 140 may be formed between the first interlayer insulating film 20 and the first region 200, G6-1 of the sixth gate electrode G6 and between the first interlayer insulating film 20 and the second region 201, G6-2 of the sixth gate electrode G6. The interfacial film 130 may be formed by oxidizing a portion of the first to fourth fin-type patterns F1-F4. The interfacial film 130 may be formed along the profile of the first to fourth fin-type patterns F1-F4 protruding upward further than the upper surface of the first interlayer insulating film 20. In an embodiment in which the first to fourth fin-type patterns F1-F4 are silicon fin-type patterns including silicon, the interfacial film 130 may include a silicon oxide film.

As illustrated in FIG. 3, the interfacial film 130 may not be formed along the upper surface of the first interlayer insulating film 20 and is only formed along the upper surface of the first to fourth fin-type patterns F1-F4; however, example embodiments are not limited thereto. Depending on methods of forming the interfacial film 130, the interfacial film 130 may be formed along the upper surface of the first interlayer insulating film 20.

In an alternative embodiment, when the first interlayer insulating film 20 includes silicon oxide and when the silicon oxide included in the first interlayer insulating film 20 has different properties from the silicon oxide film included in the interfacial film 130, the interfacial film 130 may be formed along the upper surface of the first interlayer insulating film 20.

The high-k dielectric film 140 may be formed between the interfacial film 130 and the first region 200, G6-1 of the sixth gate electrode G6 and between the interfacial film 130 and the second region 201, G6-2 of the sixth gate electrode G6. The high-k dielectric film 140 may be formed along the profile of the first to fourth fin-type patterns F1-F4 protruding upward further than the upper surface of the first interlayer insulating film 20. Further, the high-k dielectric film 140 may be formed between the first region 200, G6-1 of the sixth gate electrode G6 and between the second region 201, G6-2 of the sixth gate electrode G6 and the first interlayer insulating film 20.

The high-k dielectric film 140 may include, for example, a high-k dielectric material having a higher dielectric constant than a silicon oxide film. For example, the high-k dielectric film 140 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate; however, the present inventive concepts are not limited thereto.

The gate spacer 160 may be disposed on the sidewalls of the first region 200, G6-1 of the sixth gate electrode G6 and the sidewalls of the second region 201, G6-2 of the sixth gate electrode G6 extending in the second direction Y. The gate spacer 160 may include, for example, at least one of silicon nitride (SiN), silicon oxynitride (SiON), silicon oxide (SiO$_2$), silicon oxycarbonitride (SiOCN), and a combination thereof.

The gate spacer 160 is illustrated as being a single film as an example, but the gate spacer 160 may be multiple spacers in which a plurality of films are stacked. A shape of the gate spacer 160 and respective shapes of the multiple spacers forming the gate spacer 160 may be an I or an L shape, or a combination thereof, depending on the fabrication process and use.

Referring to FIG. 2, the source/drain E1 may be formed on opposite sides of the first region 200, G6-1 of the sixth gate electrode G6 in the first direction X, and on the first to fourth fin-type patterns F1-F4. The source/drain E1 may be formed on the first to fourth fin-type patterns F1-F4, respectively. The source/drain E1 may contact portions of sidewalls of the gate spacers 160 and portions of a bottom surface of the gate spacers 160.

The source/drain E1 may be formed on the second portion F1-2 of the first fin-type pattern F1. Likewise, source/drain may be formed on the second to the fourth fin-type patterns F2 to F4, respectively.

The source/drain E1 may include, for example, an epitaxial layer formed by epitaxy. Further, the source/drain E1 may be a raised source/drain. For example, the source/drain E1 may be a SiGe epitaxial layer or a Si epitaxial layer. However, example embodiments are not limited thereto.

The source/drain E1 may fill a recess F1r formed in the second portions F1-2 of the first fin-type pattern F1. Likewise, recesses of the second to the fourth fin-type patterns F2 to F4 may be filled by the source/drain, respectively.

In an embodiment in which the semiconductor device according to the example embodiments is an N-type transistor in the first active region ACT1, the source/drain E1 may include a tensile stress material. For example, when the first and second fin-type patterns F1 and F2 are silicon, the source/drain E1 may be a material, for example, SiC, having a smaller lattice constant than the silicon of the first and second fin-type patterns F1 and F2. For example, the tensile stress material may enhance carrier mobility in the channel region by exerting tensile stress on the first and second fin-type patterns F1 and F2.

In an embodiment in which the semiconductor device according to an example embodiments is a P-type transistor in the second active region ACT2, the source/drain may include a compressive stress material. For example, the compressive stress material may be a material such as SiGe that has a higher lattice constant compared to the silicon Si of the third and fourth fin-type patterns F3 and F4. For example, the compressive stress material may enhance carrier mobility in the channel region by exerting compressive stress on the third and fourth fin-type patterns F3 and F4.

Referring to FIGS. 1 and 4, the first to sixth isolation film patterns I1-I6 may isolate portions of the first to eighth gate electrodes G1-G8 from other portions of the first to eighth gate electrodes G1-G8, respectively. Specifically, the first to sixth isolation film patterns I1-I6 may be formed so as to fill the trenches formed within the first interlayer insulating film 20, the second interlayer insulating film 30, and the first to eighth gate electrodes G1-G8.

That is, lower surfaces of the first to sixth isolation film patterns I1-I6 may be lower than the upper surface of the first interlayer insulating 20. Further, the upper surfaces of the first to sixth isolation film patterns I1-I6 may be the same as, that is, level with, the upper surfaces of the first to eighth gate electrodes G1-G8. This may be a result of a planarization process, but the present inventive concepts are not limited thereto. Further, the upper surfaces of the first to sixth isolation film patterns I1-I6 may be the same as, that is, level with, the upper surfaces of the second interlayer insulating film 30. This may a result of a planarization process, but the present inventive concepts are not limited thereto.

The first isolation film pattern I1 may isolate portions of each of the first to eighth gate electrodes G1-G8. The first isolation film pattern I1 may extend in the first direction X. The first isolation film pattern I1 may isolate portions of all of the first to eighth gate electrodes G1-G8 with one single pattern. Accordingly, the first regions G1-1 to G8-1 of the first to eighth gate electrodes may be defined by the first isolation film pattern I1. That is, one end of each of the first regions G1-1 to G8-1 of the first to eighth gate electrodes G1 to G8 in the second direction Y may be in contact with the first isolation film pattern I1.

The second isolation film pattern I2 may isolate portions of each of the first to eighth gate electrodes G1-G8. The second isolation film pattern I2 may extend in the first direction X. The second isolation film pattern I2 may isolate portions of all of the first to eighth gate electrodes G1-G8 with one single pattern. Accordingly, the second regions G1-2 to G3-2 of the first to third gate electrodes G1-G3, respectively, and the second regions G6-2 to G8-2 of the sixth to eighth gate electrodes G6-G8, respectively, and the third regions G4-3, G5-3 of the fourth and fifth gate electrodes G4 and G5, respectively, may be defined. That is, one end of the second regions G1-2 to G3-2 of the first to third gate electrodes G1-G3, respectively, and the second regions G6-2 to G8-2 of the sixth to eighth gate electrodes G6-G8, respectively, and the third regions G4-3, G5-3 of the fourth and fifth gate electrodes G4 and G5, respectively, in the second direction Y, may be in contact with the second isolation film pattern I2.

The third isolation film pattern I3 may isolate portions of each of the fourth and fifth gate electrodes G4 and G5. The third isolation film pattern I3 may extend in the first direction X and may be in contact with the fourth and fifth gate electrodes G4 and G5, but may not be in contact with the first to third gate electrodes G1-G3 and the sixth to eighth gate electrodes G6-G8. The third isolation film pattern I3 may isolate the first region G4-1 from the second region G4-2 of the fourth gate electrode G4. The third isolation film pattern I3 may isolate the first region G5-1 and the second region G5-2 of the fifth gate electrode G5. That is, the other end of the first regions G4-1 and G5-1 of the fourth and fifth gate electrodes G4 and G5 in the second direction Y may be in contact with the third isolation film pattern I3. Further, one end of the second regions G4-2 and G5-2 of the fourth and fifth gate electrodes G4 and G5 may be in contact with the third isolation film pattern I3.

The third isolation film pattern I3 may be formed between the first isolation film pattern I1 and the first active region ACT1. That is, a double pattern, that is, an overlap of the third isolation film pattern I3 and the first isolation film pattern I1 may be formed on one side surface of the first active region ACT1. As a result, a distance a1 between the first active region ACT1 and the isolation film pattern, for example, first isolation film pattern I1, spaced apart therefrom in the first to third gate electrodes G1-G3 and the sixth to eighth gate electrodes G6-G8, may be greater than a distance a2 between the first active region ACT1 and the isolation film pattern, for example, isolation film pattern I3, spaced apart therefrom in the fourth and fifth gate electrodes G4 and G5.

The fourth isolation film pattern I4 may isolate portions of each of the fourth and fifth gate electrodes G4 and G5. The fourth isolation film pattern I4 may extend in the first direction X and may be in contact with the fourth and fifth gate electrodes G4 and G5, but may not be in contact with the first to third gate electrodes G1-G3 and the sixth to eighth gate electrodes G6-G8. The fourth isolation film pattern I4 may isolate the second region G4-2 from the third region G4-3 of the fourth gate electrode G4. The fourth isolation film pattern I4 may isolate the second region G5-2 from the third region G5-3 of the fifth gate electrode G5. That is, the other end of the second regions G4-2 and G5-2 of the fourth and fifth gate electrodes G4 and G5 in the second direction Y may be in contact with the fourth isolation film pattern I4. Further, the other end of the third regions G4-3 and G5-3 of the fourth and fifth gate electrodes G4 and G5 may be in contact with the fourth isolation film pattern I4.

The fourth isolation film pattern I4 may be formed between the second isolation film pattern I2 and the second active region ACT2. That is, a double pattern, that is, an overlap of the fourth isolation film pattern I4 and the second isolation film pattern I2, may be formed on one side surface of the second active region ACT2.

The third and fourth isolation film patterns I3, I4 may be positioned so as to overlap with each other in the second direction Y. That is, the third and fourth isolation film patterns I3, I4 may be formed at corresponding positions with reference to the first trench T1. As a result, a distance between the second active region ACT2 and the isolation film pattern, for example, second isolation film pattern I2, spaced apart therefrom in the first to third gate electrodes G1-G3 and the sixth to eighth gate electrodes G6-G8, may be greater than a distance between the second active region ACT2 and the isolation film pattern, for example, isolation film pattern I4, spaced apart therefrom in the fourth and fifth gate electrodes G4 and G5

The fifth isolation film pattern I5 may isolate portions of the first to third gate electrodes G1-G3. The fifth isolation film pattern I5 may extend in the first direction X and may be in contact with the first to third gate electrodes G1-G3, but may not be in contact with the fourth to eighth gate electrodes G4-G8. The fifth isolation film pattern I5 may isolate the first regions G1-1 to G3-1 from the second regions G1-2 to G3-2 of the first to third gate electrodes G1-G3, respectively. That is, the other end of the first regions G1-1, G2-1 and G3-1 of the first to third gate electrodes G1-G3 in the second direction Y may be in contact with the fifth isolation film pattern I5. Further, the other end of the second regions G1-2, G2-2 and G3-2 of the first to third gate electrodes G1-G3 may be in contact with the fifth isolation film pattern I5.

The sixth isolation film pattern I6 may isolate portions of the sixth to eighth gate electrodes G6-G8. The sixth isolation film pattern I6 may extend in the first direction X and may be in contact with the sixth to eighth gate electrodes G6-G8, but may not be in contact with the first to fifth gate electrodes G1-G5. The sixth isolation film pattern I6 may isolate the first regions G6-1 to G8-1 from the second regions G6-2 to G8-2 of the sixth to eighth gate electrodes G6-G8, respectively. That is, the other end of the first regions G6-1, G7-1 and G8-1 of the sixth to eighth gate electrodes G6-G8 in the second direction Y may be in contact with the sixth isolation film pattern I6. Further, the other end of the second regions G6-2, G7-2 and G8-2 of the sixth to eighth gate electrodes G6-G8 may be in contact with the fifth isolation film pattern I6.

The fifth and sixth isolation film patterns I5 and I6 may be positioned between the first active region ACT1 and the second active region ACT2. The fifth and sixth isolation film patterns I5, I6 may be positioned so as to overlap with each other in the first direction X. That is, the fifth and sixth isolation film patterns I5 and I6 may be formed at corresponding positions with reference to the fourth and fifth gate electrodes G4, G5.

As illustrated in FIG. 1, a first void region V1 may be defined at a portion to which the fifth and sixth isolation film patterns I5 and I6 are not extendible. That is, the first void region V1 may be positioned between the fifth and sixth isolation film patterns I5 and I6 in the first direction X. The first void region V1 may be defined at a position overlapping with a region where the third and fourth isolation film patterns I3 and I4 overlap in the second direction Y, and a region where the fifth and sixth isolation film patterns I5 and I6 overlap in the first direction X.

The presence of the first void region V1 may prevent the second regions G4-2 and G5-2 of the fourth and fifth gate electrodes G4 and G5, respectively, from being isolated. Accordingly, the fourth and fifth gate electrodes G4 and G5 may be included in the first active region ACT1 and the second active region ACT2, respectively. That is, the second regions G4-2 and G5-2 of the fourth and fifth gate electrodes G4 and G5, respectively, may be included in both the first and second active regions ACT1 and ACT2. In a semiconductor device according to some example embodiments, the first active region ACT1 may be an N-type active region and the second active region ACT2 may be a P-type active region, in which case the fourth and fifth gate electrodes G4, G5 may construct a CMOS in which both PMOS and NMOS transistors exist.

The second interlayer insulating film 30 and the first to sixth isolation film patterns I1-I6 may be formed of different materials. The second interlayer insulating film 30 and the first to sixth isolation film patterns I1-I6 may have different stress characteristics from each other. For example, the second interlayer insulating film 30 may have tensile stress characteristic, and the first to sixth isolation film patterns I1-I6 may have compressive stress characteristics. Accordingly, the stresses exerted onto the first active region ACT1 and the second active region ACT2 may vary from each other, depending on layout positions of the first to sixth isolation film patterns I1-I6.

Further, the second interlayer insulating film 30 and the first to sixth isolation film patterns I1-I6 may have the same stress characteristics as each other. In such an embodiment, even the same stress characteristics may have different intensities from each other. For example, the second interlayer insulating film 30 may have weaker stress intensity than the stress intensity of the first to sixth isolation film patterns I1-I6. Accordingly, the stresses exerted onto the first active region ACT1 and the second active region ACT2 may vary from each other, depending on layout positions of the first to sixth isolation film patterns I1-I6.

As a result, the threshold voltage of the transistor in the first active region ACT1 and the second active region ACT2 may vary due to influence from the stress, which will be explained in detail below.

Figure 5:
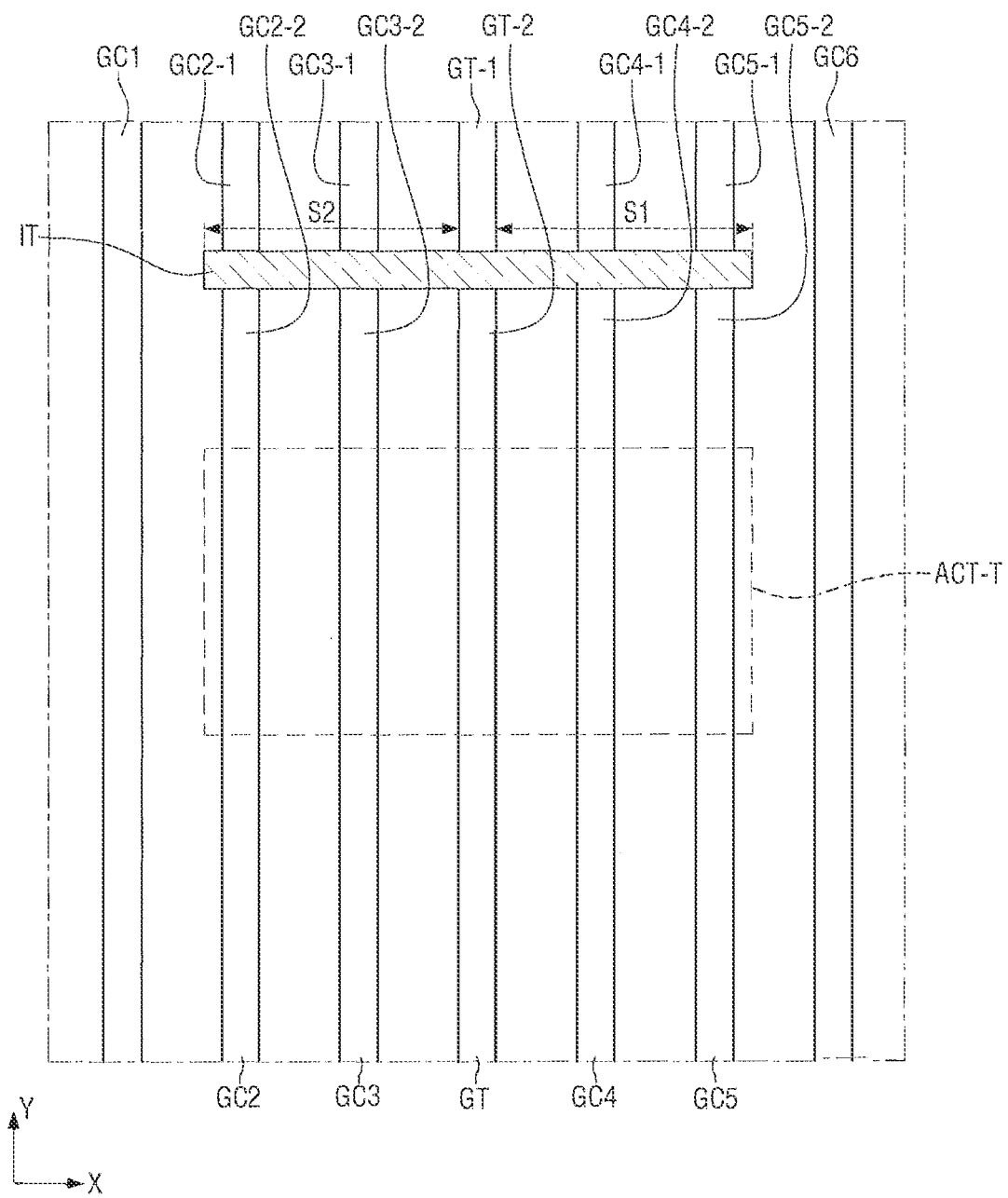
FIG. 5 is an layout diagram illustrating an influence of a length of an isolation film pattern on an active region.
Figure 6:
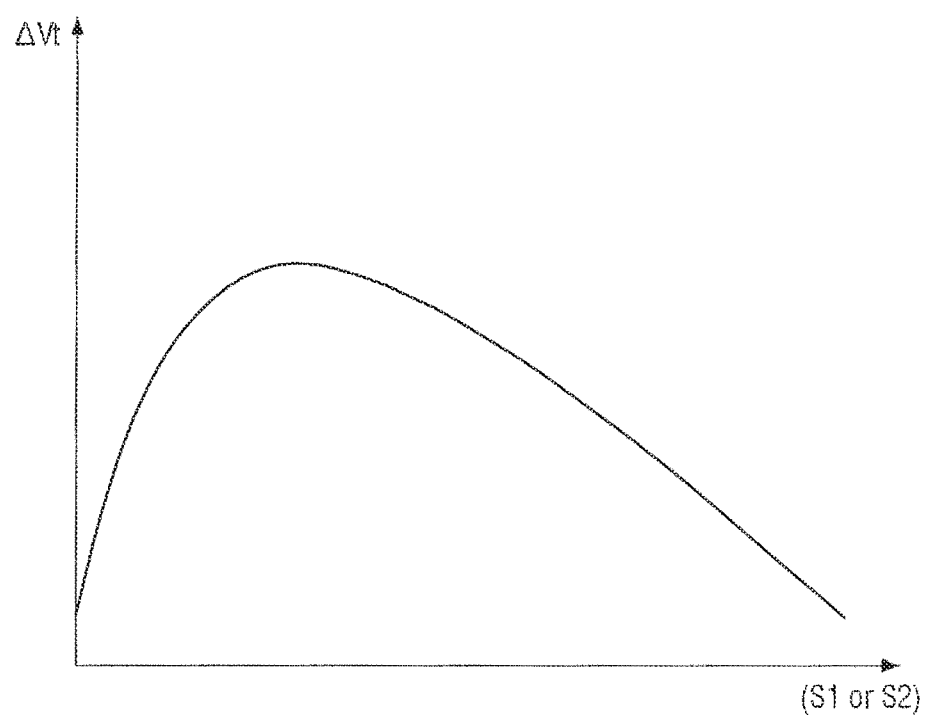
FIG. 6 is a graphical representation of threshold voltage (Vt) variation in a target active region according to distances of FIG. 5.
Figure 7:
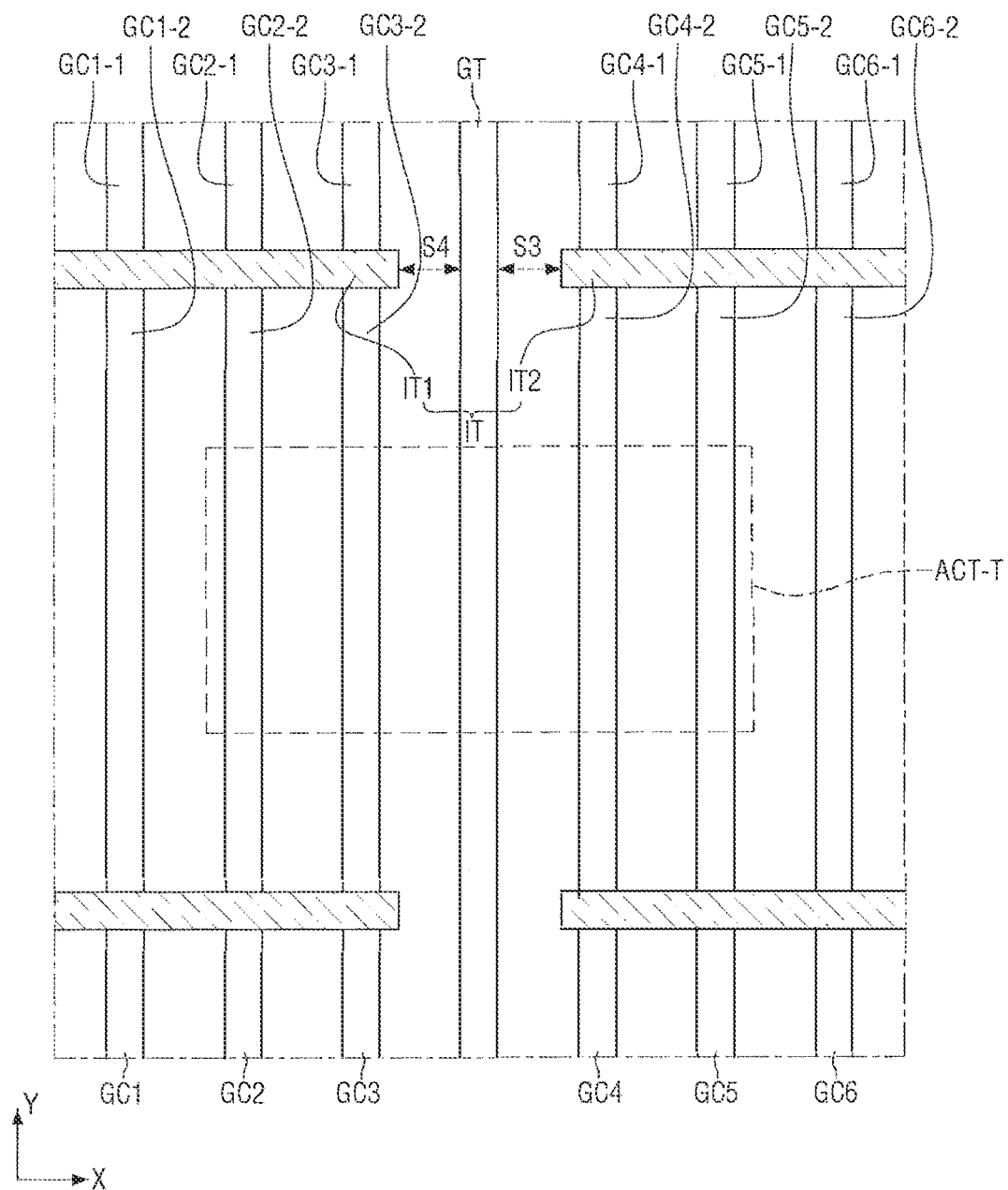
FIG. 7 is a layout diagram illustrating an influence of a distance to an isolation film pattern on an active region.
Figure 8:
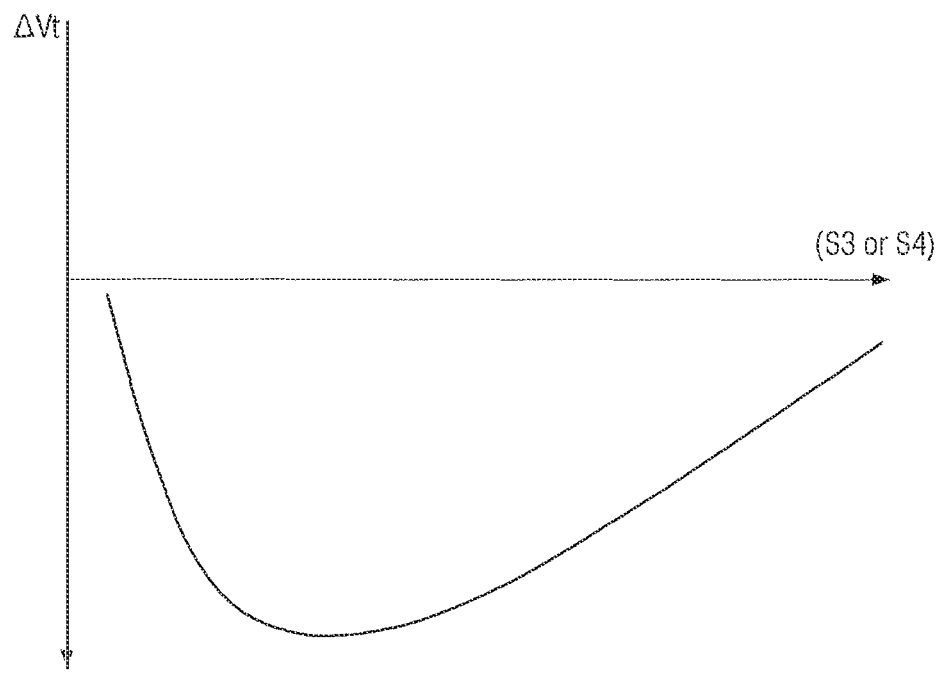
FIG. 8 is a graphical representation of threshold voltage (Vt) variation in a target active region according to distances of FIG. 7.

FIGS. 5 to 8 are views illustrating changes in a threshold voltage of a transistor according to position of an isolation film pattern of a semiconductor device according to some example embodiments. Specifically, FIG. 5 is a layout diagram illustrating an influence of a length of an isolation film pattern on an active region, and FIG. 6 is a graphical representation of threshold voltage (Vt) variation in a target active region ACT-T according to distances S1 or S2 of FIG. 5. FIG. 7 is a layout diagram illustrating an influence of the distance to the isolation film pattern on the active region, and FIG. 8 is a graphical representation of threshold voltage (Vt) variation in a target active region ACT-T according to distances S3 or S4 of FIG. 7.

An example semiconductor device of FIGS. 5 and 6 includes a target gate electrode GT, first to sixth neighboring gate electrodes GC1-GC6, a target isolation film pattern IT, and a target active region ACT-T.

Referring to FIG. 5, the target gate electrode GT may extend in the second direction Y. The target gate electrode GT may extend in parallel with the first to sixth neighboring gate electrodes GC1-GC6 in the second direction Y. The target gate electrode GT may be spaced apart from the first to sixth neighboring gate electrodes GC1-GC6 in the first direction X.

The first to sixth neighboring gate electrodes GC1-GC6 may be formed on both side surfaces of the target gate electrode GT. Specifically, the first to third neighboring gate electrodes GC1-GC3 may be formed on one side of the target gate electrode GT, and the fourth to sixth neighboring gate electrodes GC4-GC6 may be formed on the other side of the target gate electrode GT opposite the one side of the target gate electrode GT. The target gate electrode GT and the first to sixth neighboring gate electrodes GC1-GC6 may be spaced apart in the first direction X at a same, constant, pitch.

Although not illustrated, the first interlayer insulating film 20 (FIG. 3) and the second interlayer insulating film 30 (FIG. 2), which may be stacked sequentially, may be formed between the target gate electrode GT and the first to sixth neighboring gate electrodes GC1-GC6, respectively.

The target active region ACT-T may be formed so as to overlap with the target gate electrode GT and the second to fifth neighboring gate electrodes GC2-GC5. However, note that the above embodiment is merely an example embodiment, and the dimensions of the target active region ACT-T may not be limited thereto.

The target isolation film pattern IT may extend in the first direction X. The target isolation film pattern IT may isolate portions of the target gate electrode GT in the second direction Y. The target isolation film pattern IT may isolate at least a portion of each of the first to sixth neighboring gate electrodes GC1-GC6 in the second direction Y. While FIG. 5 illustrates the target isolation film pattern IT isolating the second to fifth neighboring gate electrodes GC2-GC5, this is merely an example embodiment. That is, the target isolation film pattern IT may isolate the target gate electrode GT, and isolate at least a portion of each of the first to sixth neighboring gate electrodes GC1-GC6.

Accordingly, distances S1 and S2 from the target gate electrode GT to both ends of the target isolation film pattern IT may vary, respectively. Accordingly, stress exerted onto the target active pattern ACT-T may vary, which may in turn cause the threshold voltage of the transistor of the target active pattern ACT-T to vary.

FIG. 6 is a graphical representation of the threshold voltages Vt of a semiconductor device of the target gate electrode GT in the target active region ACT-T of FIG. 5, plotted along a distance Si or S2 from the target gate electrode GT to one end of the target isolation film pattern IT of FIG. 5.

Referring to FIG. 6, the threshold voltage variation ΔVt may decrease, when the distance Si or S2 from the target gate electrode GT to one end of the target isolation film pattern IT is close to 0, or when it is increased to or above a specific value, that is, a peak value of the graph of FIG. 6. That is, influence on the target active region ACT-T may decrease, when the target isolation film pattern IT does not extend in the first direction X at all, that is, when the distance Si or S3 is close to zero, or rather, when it extends beyond a certain, large, distance in the first direction X.

The distance Si from the target gate electrode GT to one end of the target isolation film pattern IT, and the distance S2 from the target gate electrode GT to the other end of the target isolation film pattern IT may independently influence the target active region ACT-T, respectively. Accordingly, the final influence on the target active region ACT-T may be expressed as a result of superposition of the influence of the distance Si from the target gate electrode GT to one end of the target isolation film pattern IT, and the influence of the distance S2 to the other end of the target isolation film pattern IT.

An example embodiment of a semiconductor device of FIGS. 7 and 8 includes a target gate electrode GT, first to sixth neighboring gate electrodes GC1-GC6, a target isolation film pattern IT, and a target active region ACT-T. The semiconductor device in FIG. 7 may be almost similar to the device in FIG. 5, except for the different shape of the target isolation film pattern IT.

The target isolation film pattern IT may extend in the first direction X. The target isolation film pattern IT may isolate at least a portion of each of the first to sixth neighboring gate electrodes GC1-GC6 in the second direction Y. While FIG. 5 illustrates the target isolation film pattern IT isolating the second to fifth neighboring gate electrodes GC2-GC5, this is merely an example embodiment. That is, the target isolation film pattern IT may not isolate the target gate electrode GT as illustrated in FIG. 1, but isolate at least a portion of the first to sixth neighboring gate electrodes GC1-GC6.

The target isolation film pattern IT may include a first target isolation film pattern IT1 positioned on one side of the target gate electrode GT, and a second target isolation film pattern IT2 positioned on the other side of the target gate electrode GT.

The distance S3 from the target gate electrode GT to the second target isolation film pattern IT2, and the distance S4 to the first target isolation film pattern IT1 may vary from each other. Accordingly, stress exerted onto the target active pattern may vary, which may in turn cause the threshold voltage Vt of the transistor of the target active pattern ACT-T to vary.

FIG. 8 is a graphical representation of the threshold voltages Vt of a semiconductor device of the target gate electrode GT in the target active region ACT-T of FIG. 7, plotted along a distance S3 from the target gate electrode GT to the second target isolation film pattern IT2, or a distance S4 to the first target isolation film pattern IT1.

Referring to FIG. 8, the threshold voltage variation ΔVt may decrease, when the distance S3 from the target gate electrode GT to the second target isolation film pattern IT2, or the distance S4 to the first target isolation film pattern IT1 is close to 0, or when it is increased to or above a specific value, a peak value of the graph of FIG. 8. That is, influence on the target active region ACT-T may decrease, when the target isolation film pattern IT contacts the target gate electrode GT, or when it is spaced apart from the target gate electrode GT by a certain, large distance in the first direction X.

The distance S3 from the target gate electrode GT to the second target isolation film pattern IT2, or the distance S4 to the first target isolation film pattern IT1 may independently influence the target active region ACT-T, respectively. Accordingly, the final influence on the target active region ACT-T may be expressed as a result of superposition of the influence of the distance S3 from the target gate electrode GT to the second target isolation film pattern IT2, and the influence of the distance S4 to the first target isolation film pattern IT1.

That is, it may be interpreted that the transistor threshold voltage Vt in the target active region ACT-T is varied according to the first direction X length (S3 or S4) of a void region free of isolation film pattern.

Referring back to FIG. 1, the first void region V1 may be formed by the fifth and sixth isolation film patterns I5 and I6. Accordingly, the fourth and fifth gate electrodes G4 and G5 may have variation in the threshold voltage Vt due to the stress. Accordingly, uniformity and reliability of the semiconductor device may be degraded by the fourth and fifth gate electrodes G4 and G5.

In order to prevent a degradation of uniformity and reliability of the semiconductor device, in a semiconductor device according to some example embodiments, the third and fourth isolation film patterns I3 and I4 may be formed so as to isolate portions of the fourth and fifth gate electrodes G4 and G5, respectively. Accordingly, the stress by the fifth and sixth isolation film patterns I5 and I6, and the stress by the third and fourth isolation film patterns I3 and I4 may be neutralized. As a result, threshold voltage variation ΔVt may decrease.

Specifically, because the first active region ACT1 and the second active region ACT2 are of different conductivity types from each other, the threshold voltage change due to the first void region V1 may occur in opposite directions to each other. Accordingly, the effect of forming the third and fourth isolation film patterns I3, I4 can be further maximized.

Hereinbelow, a semiconductor device according to some example embodiments will be described with reference to FIGS. 1, 2, 9 and 10. Elements or operations overlapping with the example embodiments described above with reference to FIGS. 1 to 8 will be mentioned as briefly as possible or omitted for the sake of brevity.

Figure 9:
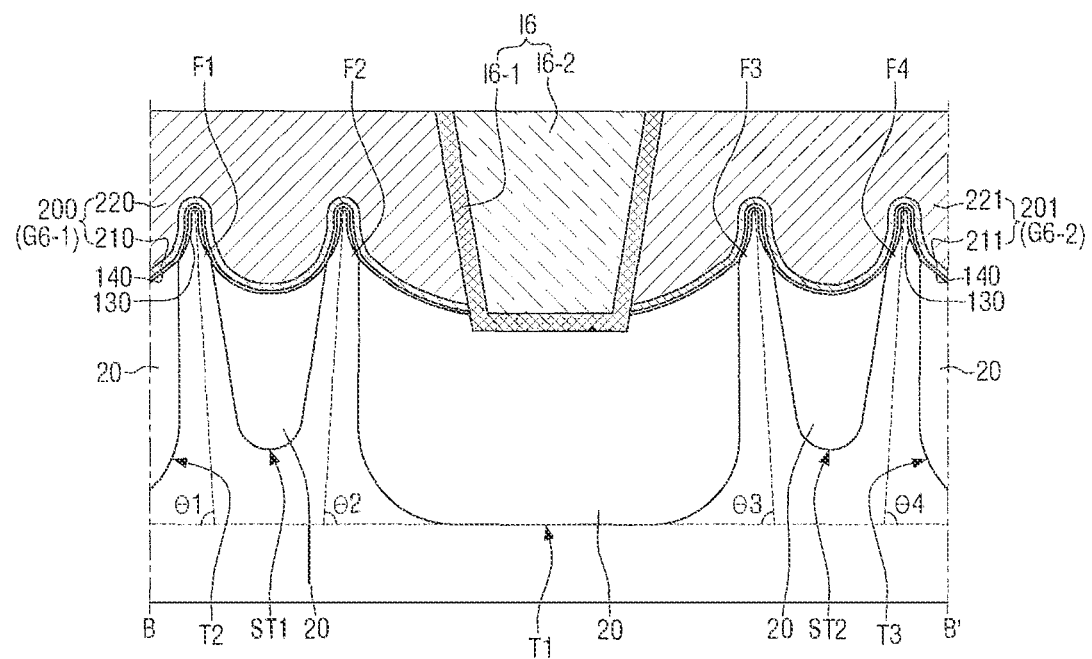
FIGS. 9 and 10 are cross-sectional views illustrating a semiconductor device according to some example embodiments of the present inventive concepts.
Figure 10:
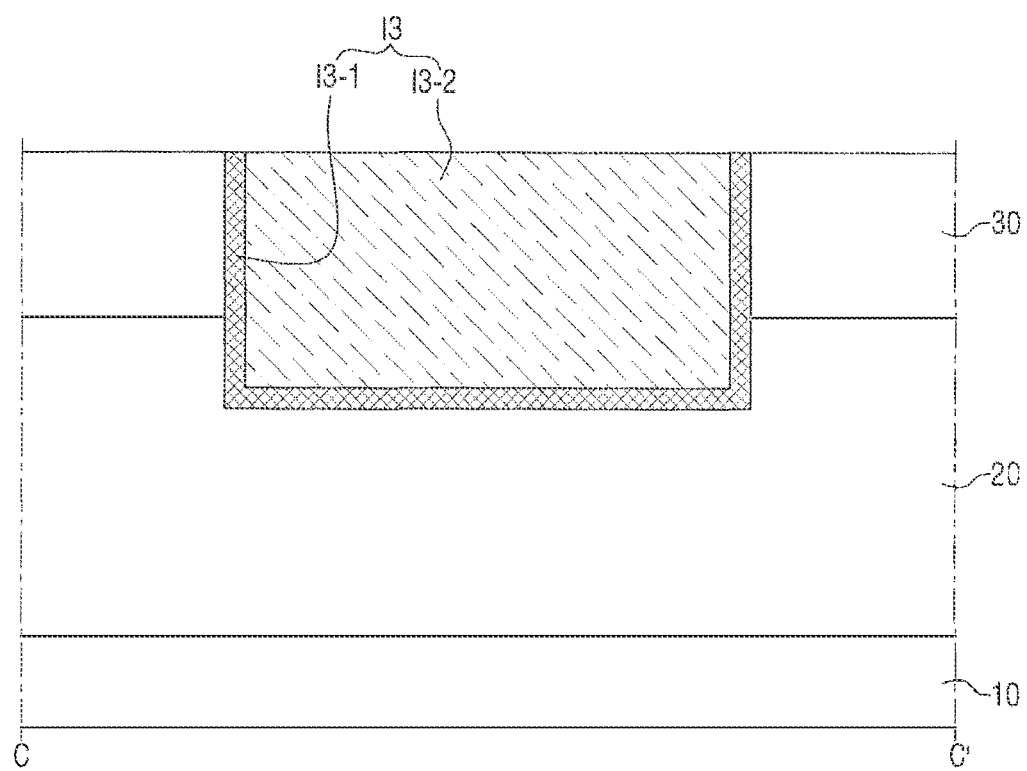

FIGS. 9 and 10 are cross-sectional views illustrating a semiconductor device according to some exemplary embodiments. Specifically, FIG. 9 is a cross-sectional view taken along B-B' of FIG. 1 and FIG. 10 is a cross-sectional view taken along C-C' of FIG. 1.

Referring to FIGS. 1, 2, 9 and 10, in a semiconductor device according to some exemplary embodiments, the first to sixth isolation film patterns I1-I6 may be multiple films, rather than single films as illustrated in FIGS. 3 and 4. For convenience of explanation, the sixth isolation film pattern I6 will be explained below as an example. The first to fifth isolation film patterns I1-I5 may have the same structure as the sixth isolation film pattern I6 described herein.

The sixth isolation film pattern I6 may include an outer isolation film pattern I6-1, and an inner isolation film pattern I6-2. The outer isolation film pattern I6-1 may be formed conformally on a bottom surface and a side surface of the trench in which the sixth isolation film pattern I6 is formed. The outer isolation film pattern I6-1 may not entirely fill the first trench, and accordingly, it may form a new trench, that is, second trench, therein.

The inner isolation film pattern I6-2 may fill the new, second trench. That is, the inner isolation film pattern I6-2 may be formed on the outer isolation film pattern I6-1. The inner isolation film pattern I6-2 may entirely fill the trench which is left unfilled by the outer isolation film pattern I6-1.

The inner isolation film pattern I6-2 and the outer isolation film pattern I6-1 may include different materials from each other. Accordingly, the inner isolation film pattern I6-2 and the outer isolation film pattern I6-1 may have different stress characteristics from each other, which will in turn determine the overall stress characteristic of the sixth isolation film pattern I6.

That is, the ratio of the inner isolation film pattern I6-2 and the outer isolation film pattern I6-1, and the stress characteristics of each of the inner isolation film pattern I6-2 and the outer isolation film pattern I6-1 may be selected according to the overall stress characteristic of the sixth isolation film pattern I6.

The outer isolation film pattern I6-1 may include, for example, polysilicon, and the inner isolation film pattern may include, for example, a silicon oxide film. A heat treatment may cause the sixth isolation film pattern I6 to shrink or expand so that the stress characteristic of a specific intensity is imparted.

A semiconductor device according to some example embodiments may include a composite film of the first to sixth isolation film patterns I1-I6, which may allow more precise stress regulation. Accordingly, the threshold voltage variation ΔVt generated due to the first to sixth isolation film patterns I1-I6 may be minimized.

A semiconductor device according to some example embodiments will be described with reference to FIG. 11. Elements or operations overlapping with the example embodiments described above with reference to FIGS. 1 to 10 will be mentioned as briefly as possible or omitted for the sake of brevity.

Figure 11:
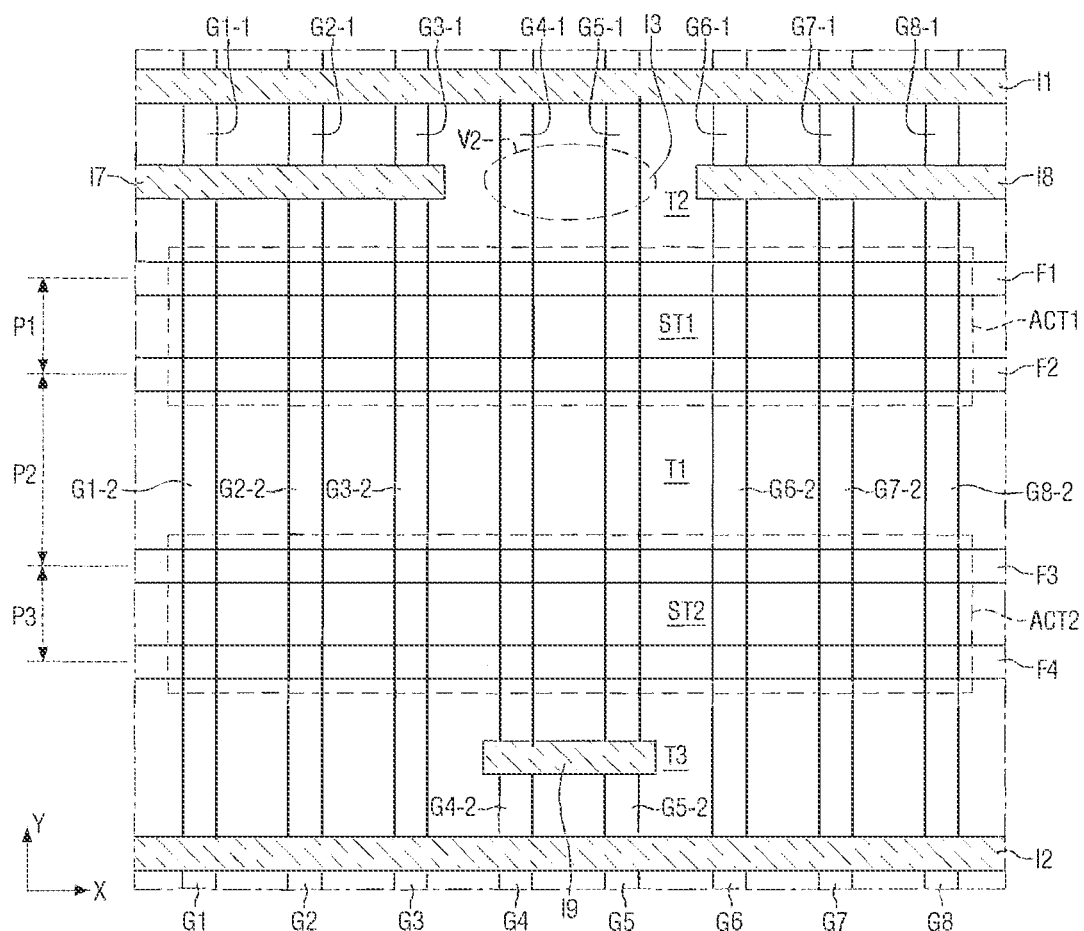
FIG. 11 is a layout diagram illustrating a semiconductor device according to some example embodiments of the present inventive concepts.

FIG. 11 is a layout diagram illustrating a semiconductor device according to some example embodiments.

Referring to FIG. 11 a semiconductor device according to some example embodiments may include first and second isolation film patterns I1 and 12 and seventh to ninth isolation film patterns I7-I9.

The seventh isolation film pattern I7 may isolate portions the first to third gate electrodes G1-G3. The seventh isolation film pattern I7 may extend in the first direction and may be in contact with the first to third gate electrodes G1-G3, but may not be in contact with the fourth to eighth gate electrodes G4-G8. The seventh isolation film pattern I7 may isolate the first regions G1-1 to G3-1 from the second regions G1-2 to G3-2 of the first to third gate electrodes G1-G3. That is, one end of the first regions G1-1, G2-1 and G3-1 of the first to third gate electrodes G1-G3 in the second direction Y may be in contact with the seventh isolation film pattern I7. Further, one end of the second regions G1-2, G2-2 and G3-2 of the first to third gate electrodes G1-G3 may be in contact with the seventh isolation film pattern I7.

The seventh isolation film pattern I7 may be formed between the first isolation film pattern I1 and the first active region ACT1. That is, a double pattern, that is, an overlap of the seventh isolation film pattern I7 and the first isolation film pattern I1, may be formed on one side surface of the first active region ACT1. As a result, a distance between the first active region ACT1 and the isolation film pattern, that is, the first isolation film pattern I1, spaced apart therefrom in the fourth to fifth gate electrodes G4-G5, may be greater than a distance between the first active region ACT1 and the isolation film pattern, that is, seventh isolation film pattern I7, spaced apart therefrom in the first to third gate electrodes G1-G3.

The eighth isolation film pattern I8 may isolate portions of the sixth to eighth gate electrodes G6-G8. The eighth isolation film pattern I8 may extend in the first direction X and may be in contact with the sixth to eighth gate electrodes G6-G8, but may not contact be in contact with the first to fifth gate electrodes G1-G5. The eighth isolation film pattern I8 may isolate the first regions G6-1 to G8-1 from the second regions G6-2 to G8-2 of the sixth to eighth gate electrodes. That is, one end of the first regions G6-1, G7-1 and G8-1 of the sixth to eighth gate electrodes G6-G8 in the second direction Y may be in contact with the eighth isolation film pattern I8. Further, one end of the second regions G6-2, G7-2 and G8-2 of the sixth to eighth gate electrodes G6-G8 may be in contact with the eighth isolation film pattern I8.

The eighth isolation film pattern I8 may be formed between the first isolation film pattern I1 and the first active region ACT1. That is, a double pattern, that is, an overlap of the eighth isolation film pattern I8 and the first isolation film pattern I1, may be formed on one side surface of the first active region ACT1. As a result, a distance between the first active region ACT1 and the isolation film pattern, that is, the first isolation film pattern I1, spaced apart therefrom in the fourth and fifth gate electrodes G4 and G5, may be greater than a distance between the first active region ACT1 and the isolation film pattern, that is eighth isolation film pattern I8, spaced apart therefrom in the sixth to eighth gate electrodes G6-G8.

The ninth isolation film pattern I9 may isolate portions of the fourth and fifth gate electrodes G4 and G5. The ninth isolation film pattern I9 may extend in the first direction X and may be in contact with the fourth and fifth gate electrodes G4 and G5, but may not be in contact with the first to third gate electrodes G1-G3 and the sixth to eighth gate electrodes G6-G8. The ninth isolation film pattern I9 may isolate the first regions G4-1 and G5-1 and the second regions G4-2 and G5-2 of the fourth and fifth gate electrodes G4 and G5. That is, the other end of the first regions G4-1 and G5-1 of the fourth and fifth gate electrodes G4 and G5 in the second direction Y may be in contact with the ninth isolation film pattern I9. Further, the other end of the second regions G4-2 and G5-2 of the fourth and fifth gate electrodes G4 and G5 may be in contact with the ninth isolation film pattern I9.

The ninth isolation film pattern I9 may be formed between the second isolation film pattern I2 and the second active region ACT2. That is, a double pattern, that is, an overlap of the ninth isolation film pattern I9 and the second isolation film pattern I2, may be formed on one side surface of the second active region ACT2. As a result, a distance between the second active region ACT2 and the isolation film pattern, that is, second isolation film pattern I2, spaced apart therefrom in the first to third gate electrodes G1-G3 and in the sixth to eighth gate electrodes G6-G8, may be greater than a distance between the first active region ACT1 and the isolation film pattern, that is, the ninth isolation film pattern I9, spaced apart therefrom in the fourth and fifth gate electrodes G4 and G5.

As illustrated, in FIG. 11, a second void region V2 may be defined at a portion to which the seventh and eighth isolation film patterns I7 and I8 are not extendible. That is, the second void region V2 may be positioned between the seventh and eighth isolation film patterns I7 and I8 in the first direction X. The second void region V2 may be defined at a position overlapping with a region where the first and ninth isolation film patterns I1 and I9 overlap in the second direction Y, and a region where the seventh and eighth isolation film patterns I7 and I8 overlap in the first direction X.

The presence of the second void region V2 may prevent the first regions G4-1 and G5-1 of the fourth and fifth gate electrodes G4 and G5 from being isolated. Accordingly, the fourth and fifth gate electrodes G4 and G5 may be included in the first active region ACT1 and the second active region ACT2, respectively. That is, the second regions G4-2 and G5-2 of the fourth and fifth gate electrodes G4 and G5 may be included in both of the first and second active regions ACT1 and ACT2. In a semiconductor device according to some example embodiments, the first active region ACT1 may be an N-type active region and the second active region ACT2 may be a P-type active region, in which case the fourth and fifth gate electrodes G4, G5 may construct a CMOS in which both PMOS and NMOS transistors exist.

The second void region V2 may cause variation to occur in the threshold voltage Vt of the fourth and fifth gate electrodes G4 and G5 due to the stress. In response to such a variation, the ninth isolation film pattern I9 may change the threshold voltage Vt in the same direction as the second void region V2.

That is, this may further reinforce the differentiation of the threshold voltage Vt of the fourth and fifth gate electrodes G4 and G5. Accordingly, a semiconductor device according to some example embodiments may regulate the threshold voltages Vt of the fourth and fifth gate electrodes G4 and G5 in a certain direction by the second void region V2 and the ninth isolation film pattern I9. Accordingly, layouts of the second void region V2 and the ninth isolation film pattern I9 may be designed with a view to regulating a desired threshold voltage Vt.

Hereinbelow, a semiconductor device according to some example embodiments will be described with reference to FIG. 12. Elements or operations overlapping with the example embodiments described above with reference to FIGS. 1 to 11 will be mentioned as briefly as possible or omitted for the sake of brevity.

Figure 12:
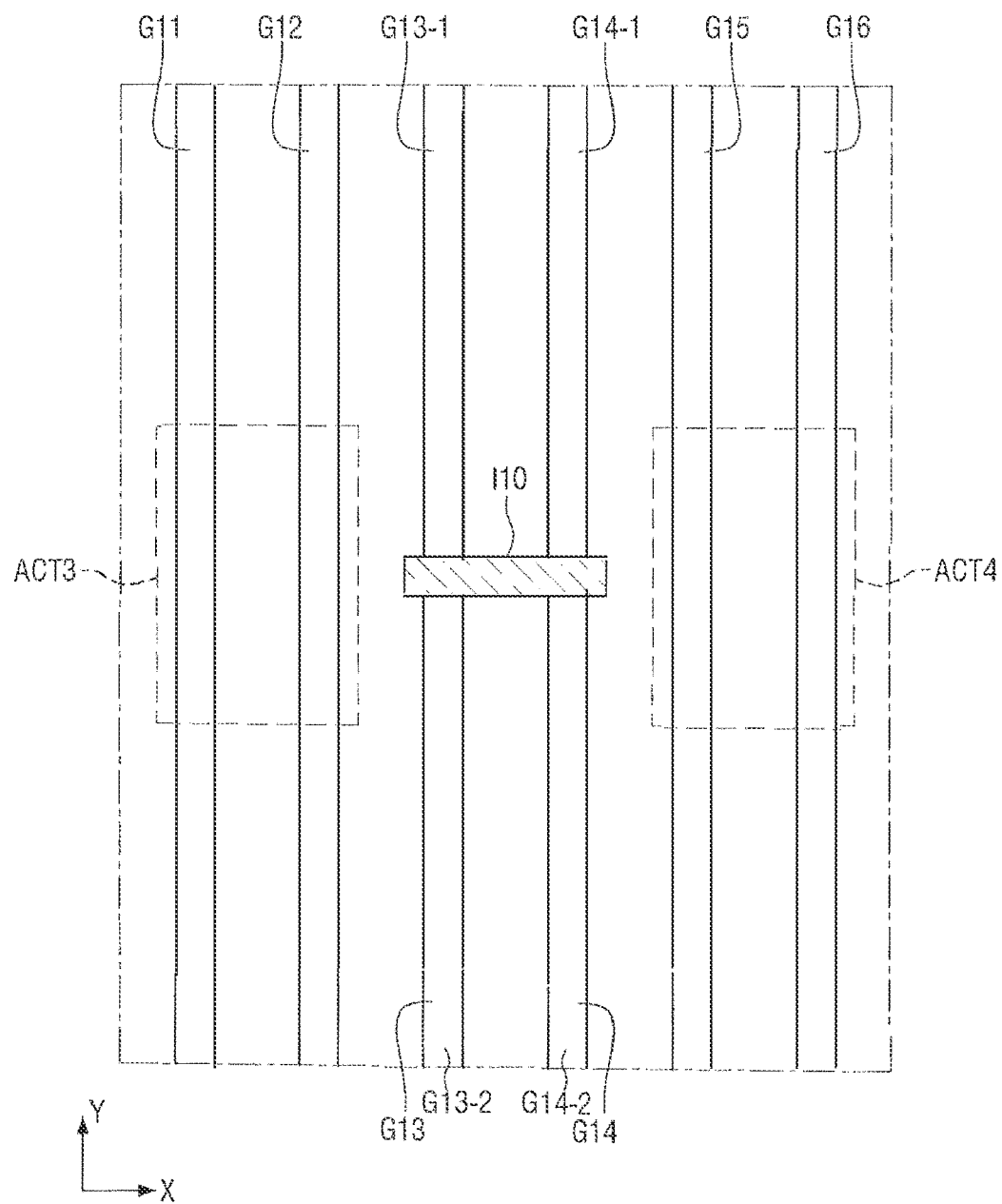
FIG. 12 is a layout diagram illustrating a semiconductor device according to some example embodiments of the present inventive concepts.

FIG. 12 is a layout diagram illustrating a semiconductor device according to some example embodiments of the present inventive concepts. Illustration of the constituent elements of the substrate, fin-type patterns, shallow trenches, and trenches is omitted for the purpose of convenience.

Referring to FIG. 12, a semiconductor device according to some example embodiments includes first to sixth gate electrodes G11-G16, a third active region ACT3, a fourth active region ACT4, and a tenth isolation film I10.

The first to sixth gate electrodes G11-G16 may extend in the second direction Y. The first to sixth gate electrodes G11-G16 may be spaced apart from one another in the first direction X. In such an embodiment, pitches between the first to sixth gate electrodes G11-G16 may be constant; however, example embodiments are not limited thereto.

The third active region ACT3 may include the first and second gate electrodes G11 and G12. The fourth active region ACT4 may include the fifth and sixth gate electrodes G15 and G16. The third active region ACT3 and the fourth active region ACT4 may not include the third and fourth gate electrodes G13 and G14.

The tenth isolation film pattern I10 may isolate portions of the third and fourth gate electrodes G13 and G14. Specifically, the third gate electrode G13 may be divided into a first region G13-1 and a second region G13-2 by the tenth isolation film pattern I10. Further, the fourth gate electrode G14 may be divided into a first region G14-1 and a second region G14-2 by the tenth isolation film pattern I10.

The tenth isolation film pattern I10 may extend in the first direction X and may be in contact with the fourth and fifth gate electrodes G13 and G14. The tenth isolation film pattern I10 may not be in contact with the first, second, fifth and sixth gate electrodes G11, G12, G15, G16. The tenth isolation film pattern I10 may overlap with the third active region ACT3 and the fourth active region ACT4 in the first direction X. The tenth isolation film pattern I10 may be positioned between the third active region ACT3 and the fourth active region ACT4 in the first direction X.

The stress by the tenth isolation film pattern I10 may be formed stronger in the long side direction, that is, the first direction X, than in the short side direction, that is, the second direction Y. This is a result of a shrink rate or expansion rate of the tenth isolation film pattern I10 is higher in the long side direction than in the short side direction.

Accordingly, the tenth isolation film pattern I10 being positioned between the third active region ACT3 and the fourth active region ACT4, results in a stronger stress being exerted on the third active region ACT3 and the fourth active region ACT4.

Hereinbelow, a semiconductor device according to some example embodiments will be described with reference to FIG. 13. Elements or operations overlapping with the example embodiments described above with reference to FIGS. 1 to 12 will be mentioned as briefly as possible or omitted for the sake of brevity.

Figure 13:
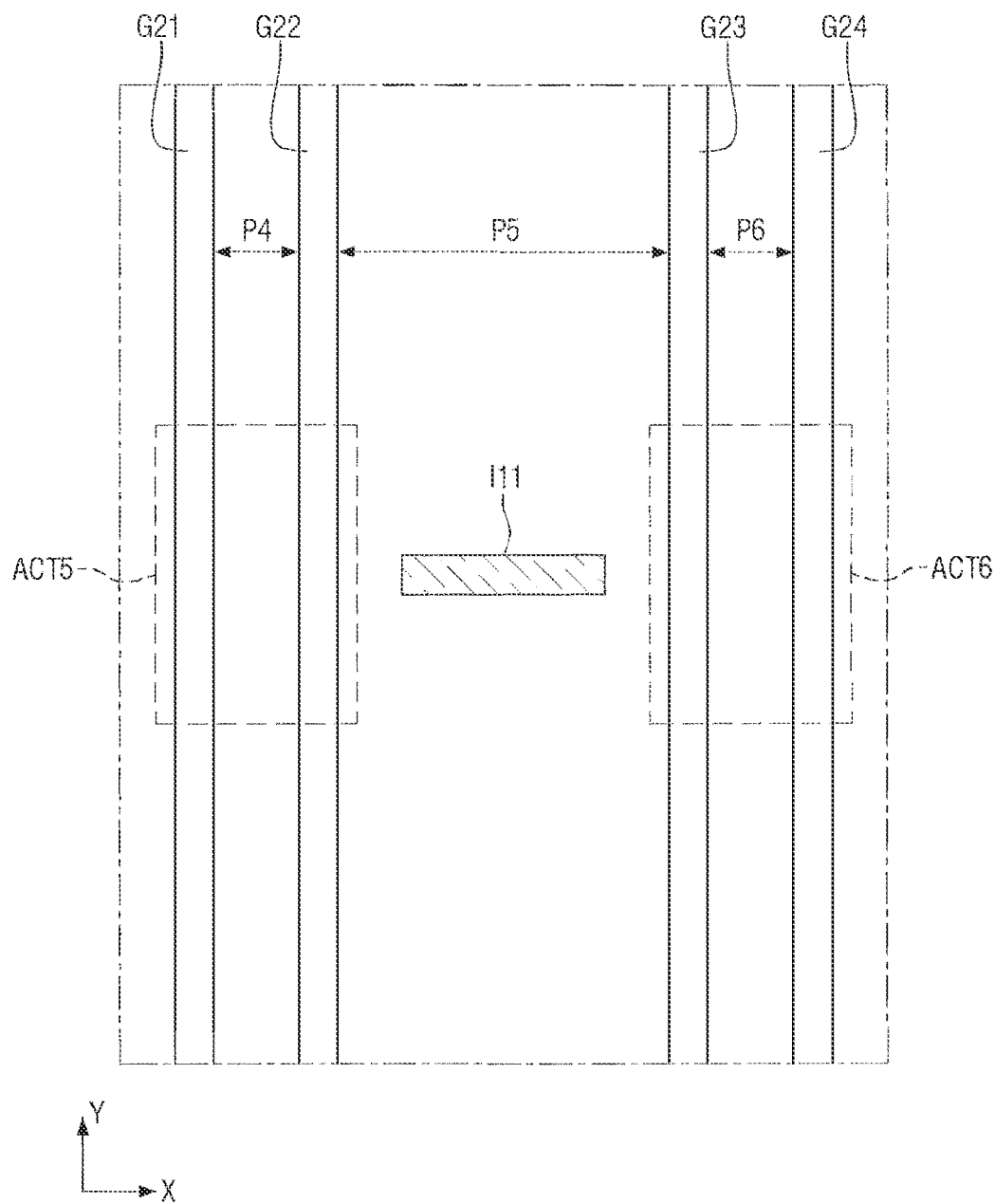
FIG. 13 is a layout diagram illustrating a semiconductor device according to some example embodiments of the present inventive concepts.

FIG. 13 is a layout diagram illustrating a semiconductor device according to some example embodiments of the present inventive concepts. Illustration of the constituent elements of the substrate, fin-type patterns, shallow trenches, and trenches is omitted for the purpose of convenience.

Referring to FIG. 13, a semiconductor device according to some example embodiments includes first to fourth gate electrodes G21-G24, a fifth active region ACT5, a sixth active region ACT6, and an eleventh isolation film I11.

The first to fourth gate electrodes G21-G24 may extend in the second direction Y. The first to fourth gate electrodes G21-G24 may be spaced apart from one another in the first direction X. In such an embodiment, pitches between the first to fourth gate electrodes G21-G24 may not be constant.

Specifically, a pitch P4 between the first gate electrode G21 and the second gate electrode G22 may be less than a pitch P5 between the second gate electrode G22 and the third gate electrode G23. Further, a pitch P6 between the third gate electrode G23 and the fourth gate electrode G24 may be less than the pitch P5 between the second gate electrode G22 and the third gate electrode G23. The pitch P4 and the pitch P6 may be the same. That is, the pitch P5 between the second gate electrode G22 and the third gate electrode G23 may be the greatest pitch.

The fifth active region ACT5 may include the first and second gate electrodes G21 and G22. The sixth active region ACT6 may include the third and fourth gate electrodes G23 and G24.

The eleventh isolation film pattern I11 may be formed between the second and third gate electrodes G22 and G23. As a result of a gate electrode not being formed between the second and third gate electrodes G22 and G23, the eleventh isolation film pattern I11 may be formed within the first interlayer insulating film 20 (FIG. 3) and the second interlayer insulating film 30 (FIG. 2).

The eleventh isolation film pattern I11 may extend in the first direction X. The eleventh isolation film pattern I11 may not be in contact with the first to fourth gate electrodes G21-24. The eleventh isolation film pattern I11 may overlap with the fifth active region ACT5 and the sixth active region ACT6 in the first direction X. The eleventh isolation film pattern I11 may be positioned between the fifth active region ACT5 and the sixth active region ACT6 in the first direction X.

The stress by the eleventh isolation film pattern I11 may be formed stronger in the long side direction, that is, the first direction X, than in the short side direction, that is, the second direction Y. This is a result of a shrink rate or expansion rate of the eleventh isolation film pattern I11 being higher in the long side direction than in the short side direction.

Accordingly, the eleventh isolation film pattern I11 being positioned between the fifth active region ACT5 and the sixth active region ACT6, results in a stronger stress being exerted on the fifth active region ACT5 and the sixth active region ACT6.

That is, a semiconductor device according to some example embodiments may additionally have an isolation film pattern in a region without gate electrodes so that the isolation film pattern is used not only for the purpose of isolating gate electrodes, but may also be used for exerting proper stress on the active region to neutralize or reinforce the overall stress.

A semiconductor device according to some example embodiments will be described with reference to FIG. 14. Elements or operations overlapping with the example embodiment described above with reference to FIGS. 1 to 13 will be mentioned as briefly as possible or omitted for the sake of brevity.

Figure 14:
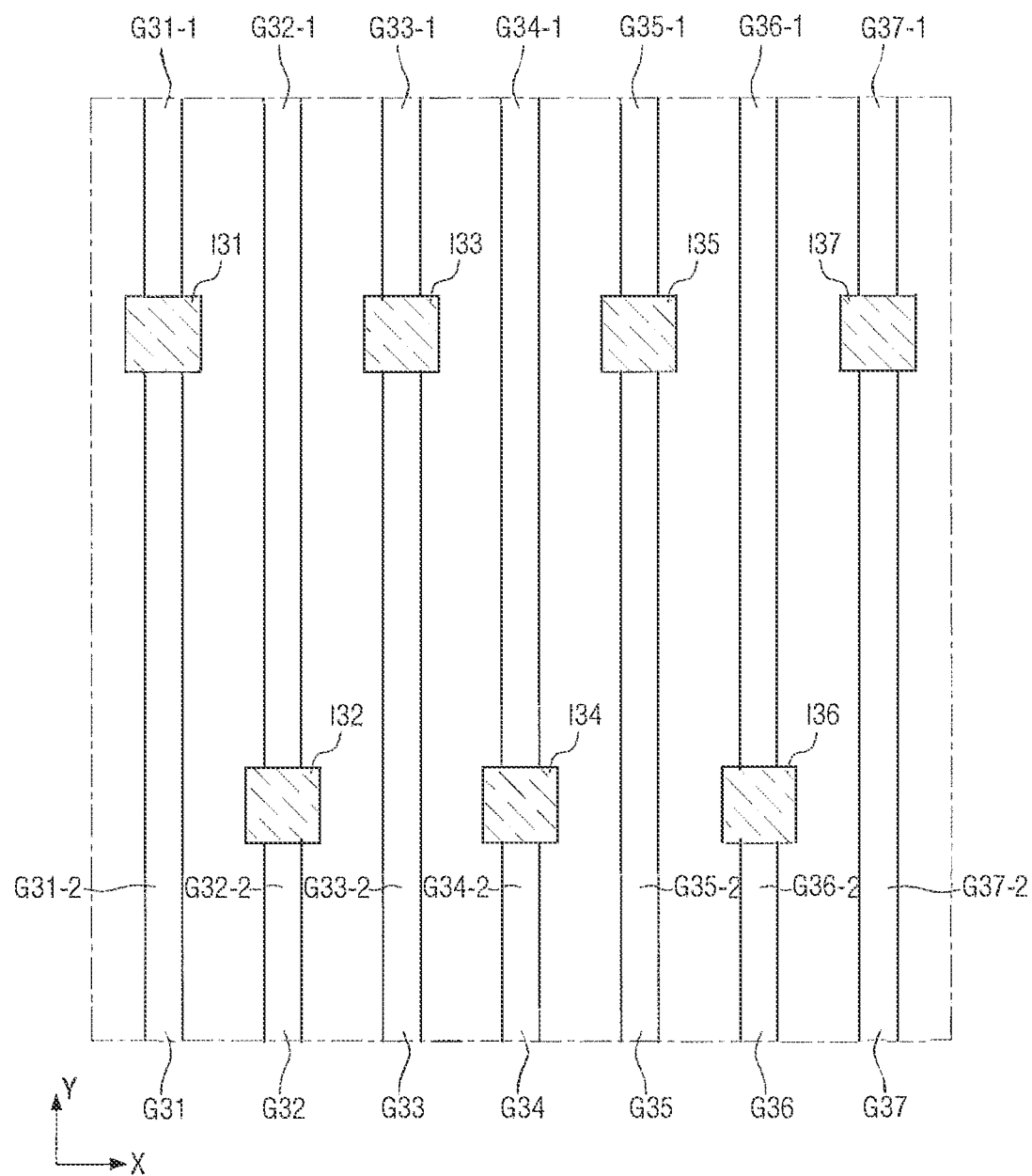
FIG. 14 is a layout diagram illustrating a semiconductor device according to some example embodiments of the present inventive concepts.

FIG. 14 is a layout diagram illustrating a semiconductor device according to some example embodiments of the present inventive concepts. Illustration of the constituent elements of the substrate, fin-type patterns, shallow trenches, and trenches is omitted for the purpose of convenience.

Referring to FIG. 14, a semiconductor device according to some example embodiments may include first to seventh gate electrodes G31-G37, and first to seventh isolation film patterns I31-I37.

The first to seventh gate electrodes G31-G37 may extend in the second direction Y. The first to seventh gate electrodes G31-G37 may be spaced apart from one another in the first direction X. In such an embodiment, pitches between the first to seventh gate electrodes G31-G37 may be constant; however, example embodiments are not limited thereto.

The first to seventh isolation film patterns I31-I37 may each contact one gate electrode. Specifically, the first isolation film pattern I31 may be in contact with the first gate electrode G31, and may not be in contact with the second to seventh gate electrodes G32-G37. The second isolation film pattern I32 may be in contact with the second gate electrode G32, and may not be in contact with the first gate electrode G31 and the third to seventh gate electrodes G33-G37. The third isolation film pattern I33 may be in contact with the third gate electrode G33, and may not be in contact with the first and second gate electrodes G31 and G32 and the fourth to seventh gate electrodes G34-G37. The fourth isolation film pattern I34 may be in contact with the fourth gate electrode G34, and may not be in contact with the first to third gate electrodes G31-G33 and the fifth to seventh gate electrodes G35-G37. The fifth isolation film pattern I35 may be in contact with the fifth gate electrode G35, and may not be in contact with the first to fourth gate electrodes G31-G34 and the sixth and seventh gate electrodes G36 and G37. The sixth isolation film pattern I36 may be in contact with the sixth gate electrode G36, and may not be in contact with the first to fifth gate electrodes G31-G35 and the seventh gate electrode G37. The seventh isolation film pattern I37 may be in contact with the seventh gate electrode G37, and may not be in contact with the first to sixth gate electrodes G31-G36.

That is, the influence on the threshold voltages Vt of the first to seventh gate electrodes G31-G37 may be minimized by minimizing extension of the first to seventh isolation film patterns I31-I37 in the first direction X. In such an embodiment, there are seven gate electrodes and seven isolation film patterns; however, the example embodiments are not limited thereto.

A semiconductor device according to some example embodiments will be described with reference to FIGS. 15 and 16. Elements or operations overlapping with the example embodiment described above with reference to FIGS. 1 to 14 will be mentioned as briefly as possible or omitted for the sake of brevity.

Figure 15:
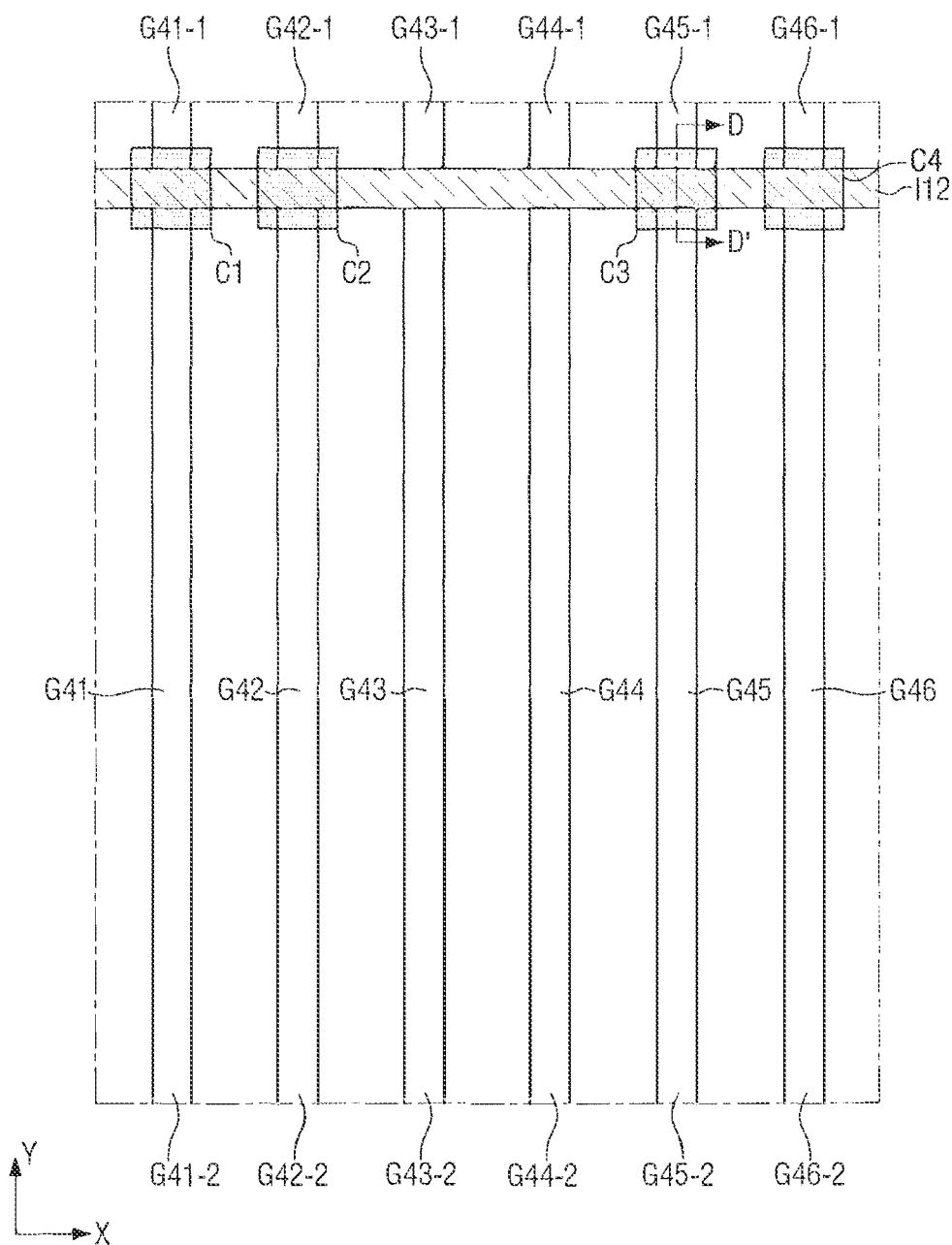
FIG. 15 is a layout diagram illustrating a semiconductor device according to some example embodiments of the present inventive concepts.
Figure 16:
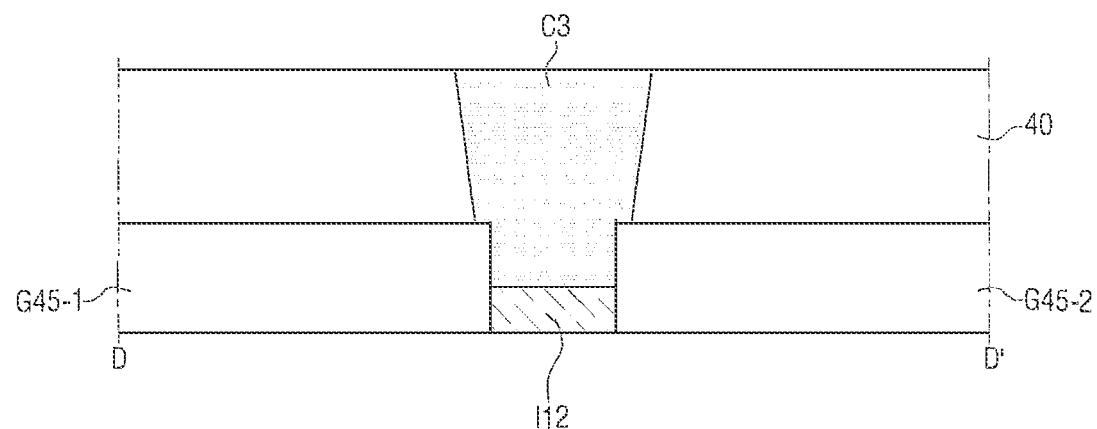
FIG. 16 is a cross-sectional view taken along line D-D' of FIG. 15.

FIG. 15 is a layout diagram illustrating a semiconductor device according to some example embodiments of the present inventive concepts, and FIG. 16 is a cross-sectional view taken along line D-D' of FIG. 15. Illustration of the constituent elements of the substrate, fin-type patterns, shallow trenches, trenches, device isolation film, and first interlayer insulating film is omitted for the purpose of convenience.

Referring to FIGS. 15 and 16, a semiconductor device according to some example embodiments includes first to sixth gate electrodes G41-G46, a twelfth isolation film pattern I12, a third interlayer insulating film 40, and first to fourth connect patterns C1-C4.

The first to sixth gate electrodes G41-G46 may extend in the second direction Y. The first to sixth gate electrodes G41-G46 may be spaced apart from one another in the first direction X. In such an embodiment, pitches between the first to sixth gate electrodes G41-G46 may be constant; however, example embodiments are not limited thereto.

The twelfth isolation film pattern I12 may isolate portions of the first to sixth gate electrodes G41-G46. The twelfth isolation film pattern I12 may extend in the first direction X and may be in contact with first to sixth gate electrodes G41-G46. The twelfth isolation film pattern I12 may isolate portions of all of the first to sixth gate electrodes G41-G46 with one single pattern. Accordingly, the first regions G41-1 to G46-1 of the first to sixth gate electrodes may be defined by the twelfth isolation film pattern 112. That is, one end of the first regions G41-1 to G46-1 of each of the first to sixth gate electrodes G41-G46 in the second direction Y may be in contact with the twelfth isolation film pattern I12. Further, one end of each of the second regions G41-2-G46-2 of the first to sixth gate electrodes G41-G46 in the direction Y may be in contact with the twelfth isolation film pattern I12.

The third interlayer insulating film 40 may be formed on the first to sixth gate electrodes G41-G46, the twelfth isolation film pattern I12, and the first interlayer insulating film 20 (FIG. 3). In such an embodiment, the third interlayer insulating film 40 may include at least one of, for example, silicon oxide, silicon nitride, silicon oxynitride, and a low-k dielectric material with a smaller dielectric constant than silicon oxide. For example, the low-k dielectric material may include flowable oxide (FOX), Tonen silazen (TOSZ), undoped silica glass (USG), borosilicate glass (BSG), phosphosilicate glass (PSG), borophosphosilicate glass (BP SG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof; however, the example embodiments are not limited thereto.

The first to fourth connect patterns C1-C4 may be formed through the third interlayer insulating film 40. The first connect pattern C1 may be formed on the first gate electrode G41, and the second connect pattern C2 may be formed on the second gate electrode G42. The third connect pattern C3 may be formed on the fifth gate electrode G45, and the fourth connect pattern C4 may be formed on the sixth gate electrode G46.

The third connect pattern C3 will be described with reference to FIG. 16. The first, second, and fourth connect patterns C1, C2, C4 are substantially the same shape as the third connect pattern C3. Accordingly, for convenience of explanation, the third connect pattern C3 will be described as an example.

The first region G45-1 of the fifth gate electrode G45, and the second region G45-2 of the fifth gate electrode G45 may be physically isolated from each other by the twelfth isolation film pattern I12. In such an embodiment, a portion of the twelfth isolation film pattern I12 and a portion of the third interlayer insulating film 40 on the twelfth isolation film pattern I12 may be removed so that a trench is formed. The trench may be filled by the third connect pattern C3. The third connect pattern C3 may contact sidewalls of the third interlayer insulating film 40 exposed by the trench, an upper surface and sidewalls of the first region G45-1 and the second region G45-2 exposed by the trench and an upper surface of twelfth isolation film pattern I12 exposed by the trench. The third connect pattern C3 may include, for example, a conductive material. The third connect pattern C3 may contact both the first region G45-1 and the second region G45-2 of the fifth gate electrode. As a result, the third connect pattern C3 may electrically connect the first region G45-1 and the second region G45-2 of the fifth gate electrode.

In a semiconductor device according to some example embodiments, the twelfth isolation film pattern I12 is shaped so as to extend longitudinally in the first direction X so that the stress influence by the twelfth isolation film pattern I12 is minimized, and later, on a level where the second interlayer insulating film 40 is formed, stress is minimized by way of re-connecting some gate electrodes that should not have been isolated.

A semiconductor device according to some example embodiments will be described with reference to FIG. 17. Elements or operations overlapping with the example embodiment described above with reference to FIGS. 1 to 16 will be mentioned as briefly as possible or omitted for the sake of brevity.

Figure 17:
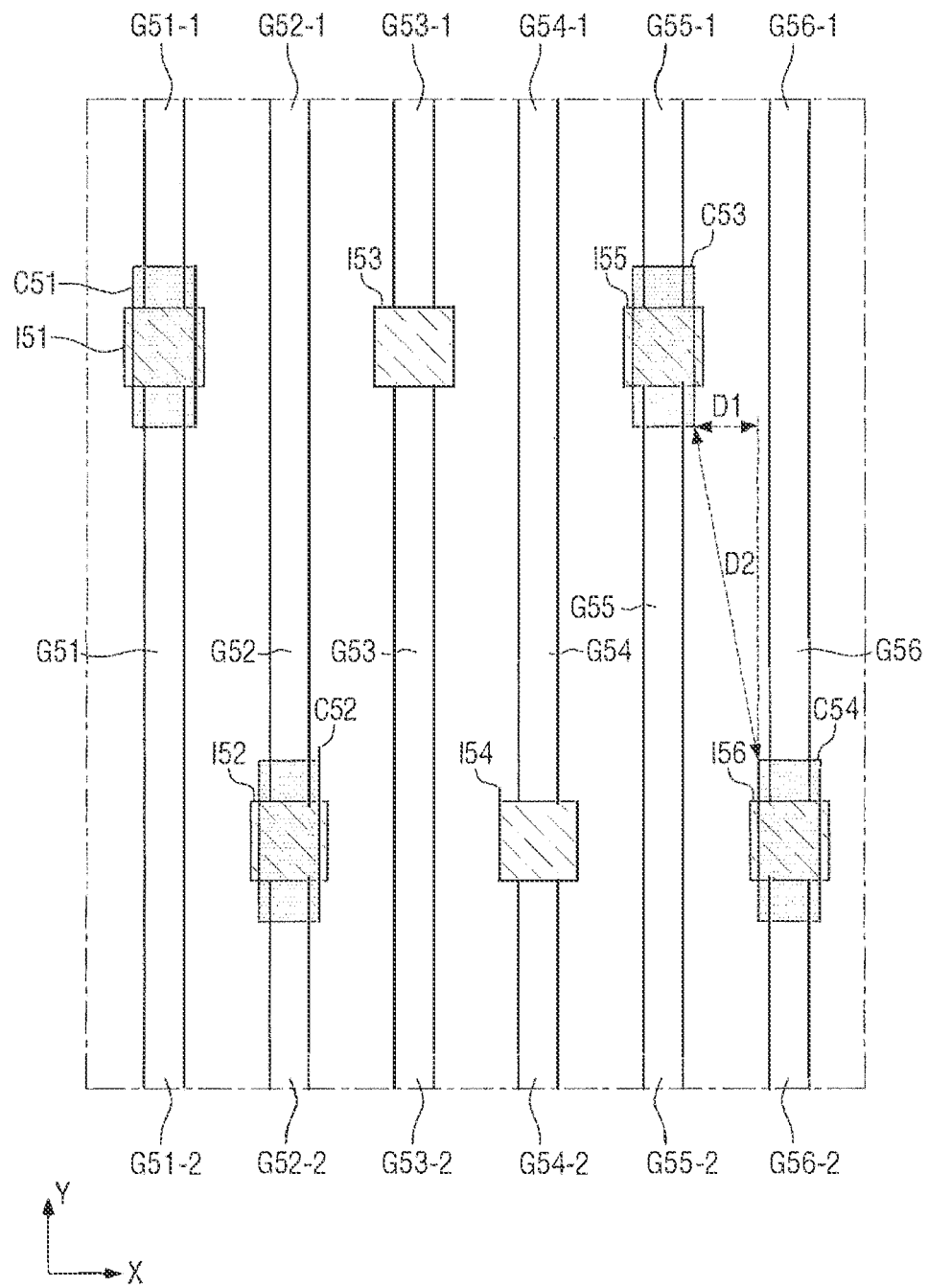
FIG. 17 is a layout diagram illustrating a semiconductor device according to some example embodiments of the present inventive concepts.

FIG. 17 is a layout diagram illustrating a semiconductor device according to some example embodiments of the present inventive concepts. Illustration of the constituent elements of the substrate, fin-type patterns, shallow trenches, trenches, device isolation film, and first interlayer insulating film is omitted for the purpose of convenience.

Referring to FIG. 17, a semiconductor device according to some example embodiments includes first to sixth gate electrodes G51-G56, first to sixth isolation film patterns I51-I56, and first to fourth connect patterns C51-C54.

The first to sixth gate electrodes G51-G56 may extend in the second direction Y. The first to sixth gate electrodes G51-G56 may be spaced apart from one another in the first direction X. In such an embodiment, the pitches between the first to sixth gate electrodes G51-G56 may be constant; however, example embodiments are not limited thereto.

The first to sixth isolation film patterns I51-I56 may each be in contact with one gate electrode. Specifically, the first isolation film pattern I51 may be in contact with the first gate electrode G51, and may not be in contact with the second to sixth gate electrodes G52-G56. The second isolation film pattern I52 may be in contact with the second gate electrode G52, and may not be in contact with the first gate electrode G51, and the third to sixth gate electrodes G53-G56. The third isolation film pattern I53 may be in contact with the third gate electrode G53, and may not be in contact with the first and second gate electrodes G51 and G52 and the fourth to sixth gate electrodes G54-G56. The fourth isolation film pattern I54 may be in contact with the fourth gate electrode G54, and may not be in contact with the first to third gate electrodes G51-G53 and the fifth to sixth gate electrodes G55-G56. The fifth isolation film pattern I55 may be in contact with the fifth gate electrode G55, and may not be in contact with the first to fourth gate electrodes G51-G54 and the sixth gate electrode G56. The sixth isolation film pattern I56 may be in contact with the sixth gate electrode G56, and may not be in contact with the first to fifth gate electrodes G51-G55. The first to fourth connect patterns C51-C54 may be formed through the third interlayer insulating film 40. The first connect pattern C51 may be formed on the first gate electrode G51, and the second connect pattern C52 may be formed on the second gate electrode G52. The third connect pattern C53 may be formed on the fifth gate electrode G55, and the fourth connect pattern C54 may be formed on the sixth gate electrode G56.

Like the first to sixth isolation film patterns I51-I56, the first to fourth connect patterns C51-C54 may overlap with one gate electrode. As a result, a short between the first to fourth connect patterns C51-C54 may be prevented.

For example, a distance D2 between the third connect pattern C53 and the fourth connect pattern C54 may become greater than the distance D1 of the example embodiment of FIG. 15. As a result, in a semiconductor device according to some example embodiments, only one gate electrode is placed in contact with each of on the first to sixth isolation film pattern I51-I56 level so that an influence on threshold voltage is minimized, and a short is prevented between the first to fourth connect pattern C51-054 level.

Figure 18:
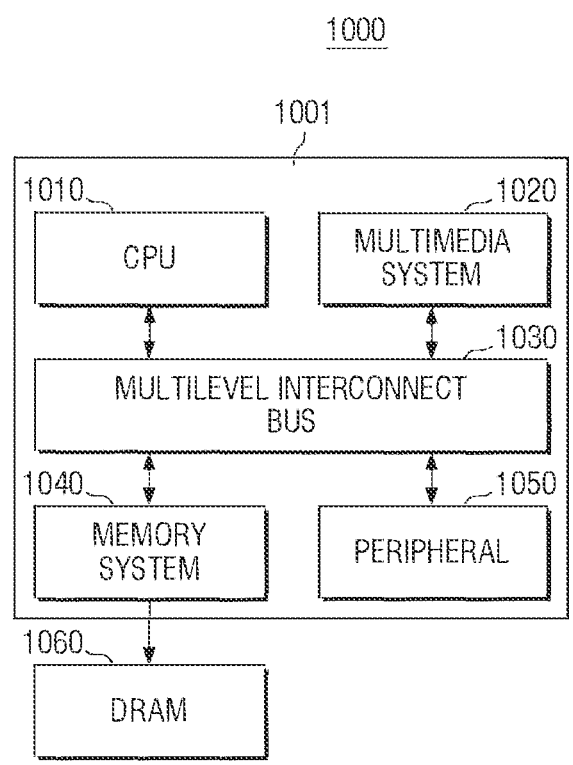
FIG. 18 is a block diagram of a system on chip (SoC) system including a semiconductor device according to example embodiments of the present inventive concepts.

FIG. 18 is a block diagram of a SoC system including a semiconductor device according to example embodiments of the present inventive concepts.

Referring to FIG. 18, a SoC system 1000 includes, for example, an application processor 1001 and a dynamic random-access memory (DRAM) 1060.

The application processor 1001 may include, for example, a central processing unit (CPU) 1010, a multimedia system 1020, a multilevel interconnect bus 1030, a memory system 1040 and a peripheral circuit 1050.

The CPU 1010 may perform an arithmetic operation necessary for driving the SoC system 1000. In some example embodiments, the CPU 1010 may be configured on a multi-core environment which includes a plurality of cores.

The multimedia system 1020 may be used for performing a variety of multimedia functions on the SoC system 1000. The multimedia system 1020 may include, for example, a 3D engine module, a video codec, a display system, a camera system, a post-processor, or the like.

The multilevel interconnect bus 1030 may be used for exchanging data communication among the CPU 1010, the multimedia system 1020, the memory system 1040 and the peripheral circuit 1050. In some example embodiments, the bus 1030 may have a multi-layer structure. Specifically, an example of the bus 1030 may be, for example, a multi-layer advanced high-performance bus (AHB), or a multi-layer advanced eXtensible interface (AXI); however, example embodiments are not limited thereto.

The memory system 1040 may provide environments necessary for the application processor 1001 to connect to an external memory, for example, DRAM 1060, and perform high-speed operation. In some example embodiments, the memory system 1040 may include a separate controller, for example, DRAM controller, to control an external memory, for example, DRAM 1060.

The peripheral circuit 1050 may provide environments necessary for the SoC system 1000 to have a seamless connection to an external device, for example, main board. Accordingly, the peripheral circuit 1050 may include a variety of interfaces to allow compatible operation with the external device connected to the SoC system 1000.

The DRAM 1060 may function as an operation memory necessary for the operation of the application processor 1001. In some example embodiments, the DRAM 1060 may be arranged externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the example embodiments explained above, for example, as described in connection with FIGS. 1-17.

Figure 19:
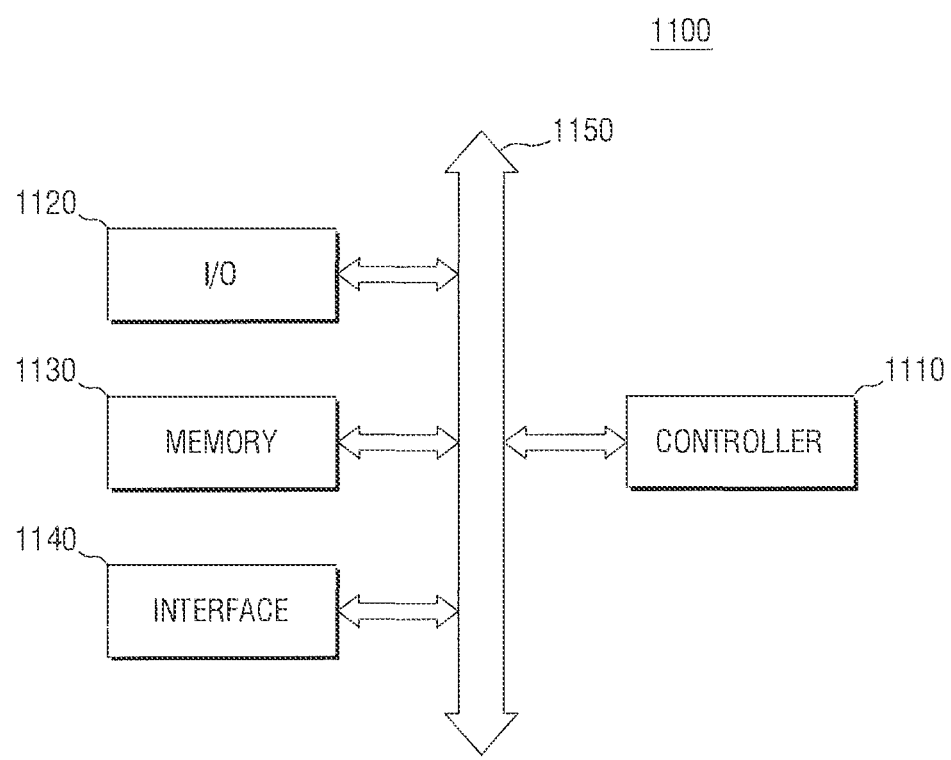
FIG. 19 is a block diagram of an electronic system including a semiconductor device according to example embodiments of the present inventive concepts.

FIG. 19 is a block diagram of an electronic system including a semiconductor device according to example embodiments of the present inventive concepts.

Referring to FIG. 19, the electronic system 1100 according to an example embodiment may include a controller 1110, an input/output (I/O) device 1120, a memory device 1130, an interface 1140 and a bus 1150. The controller 1110, the I/O device 1120, the memory device 1130 and/or the interface 1140 may be coupled to one another via the bus 1150. The bus 1150 corresponds to a path through which data travels.

The controller 1110 may include at least one of a microprocessor, a digital signal processor, a micro controller, or a logic devices capable of performing functions similar to the functions of those mentioned above, or the like. The I/O device 1120 may include, for example a keypad, a keyboard, a display device, or the like. The memory device 1130 may store data and/or commands. The interface 1140 may perform a function of transmitting or receiving data to or from communication networks. The interface 1140 may be in a wired or wireless form. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM), or the like.

According to the example embodiments described above, the semiconductor device may be provided within the memory device 1130, or provided as a part of the controller 1110 or the I/O device 1120. That is, the memory device 1130, the controller 1110 and/or the I/O device 1120 may include at least one of the semiconductor devices according to the example embodiments described above, for example, in connection with FIGS. 1-17.

The electronic system 1100 is applicable to a personal digital assistant (PDA) portable computer, a web tablet, a wireless phone, a mobile phone, a digital music player, a memory card, almost all electronic products that are capable of transmitting and/or receiving data in wireless environment, or the like.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
    a first fin-type pattern extending in a first direction;
    a second fin-type pattern extending in the first direction, the second fin-type pattern spaced apart from the first fin-type pattern by a first pitch in a second direction intersecting the first direction;
    a third fin-type pattern extending in the first direction, the third fin-type pattern spaced apart from the second fin-type pattern by a second pitch in the second direction, wherein the second pitch is wider than the first pitch;
    a fourth fin-type pattern extending in the first direction, the fourth fin-type pattern spaced apart from the third fin-type pattern by a third pitch in the second direction, wherein the second pitch is wider than the third pitch;
    a first device isolation film between the first fin-type pattern and the second fin-type pattern;
    a second device isolation film between the second fin-type pattern and the third fin-type pattern;
    first and second gate electrodes extending in the second direction on the first to fourth fin-type patterns, the first and second gate electrodes spaced apart from each other in the first direction;
    a first gate isolation film comprising a first portion isolating the first gate electrode and a second portion isolating the second gate electrode, the first portion of the first gate isolation film spaced apart from the first fin-type pattern by a fourth pitch in the second direction, the second portion of the first gate isolation film spaced apart from the first fin-type pattern by a fifth pitch in the second direction, wherein the fourth pitch is same as the fifth pitch;

a second gate isolation film spaced apart from the fourth fin-type pattern in the second direction; and a third gate isolation film on the second device isolation film, the third gate isolation film isolating the second gate electrode, wherein the third gate isolation film is not intersected by the first gate electrode, wherein the second gate electrode is divided into two portions between the first and second gate isolation films, wherein a bottom surface of the third gate isolation film is lower than a top surface of the second device isolation film, wherein a bottom surface of the second device isolation film is lower than a bottom surface of the first device isolation film, and wherein a rising angle of the second fin-type pattern in a direction of the second device isolation film is a first angle, a rising angle of the third fin-type pattern in a direction of the second device isolation film is a second angle, wherein the first and second angles are acute angles.

2. The semiconductor device of claim 1, wherein the second device isolation film comprises a first material, and wherein the third gate isolation film comprises a second material different from the first material.

3. The semiconductor device of claim 2, wherein each of the first and second gate isolation films comprises the second material.

4. The semiconductor device of claim 1, wherein the first portion of the first gate isolation film is connected to the second portion of the first gate isolation film.

5. The semiconductor device of claim 1, wherein the first portion of the first gate isolation film is aligned with the second portion of the first gate isolation film in the first direction.

6. The semiconductor device of claim 1, wherein the second gate isolation film comprises a first portion isolating the first gate electrode and a second portion isolating the second gate electrode, the first portion of the second gate isolation film spaced apart from the fourth fin-type pattern by a sixth pitch in the second direction, the second portion of the second gate isolation film spaced apart from the fourth fin-type pattern by a seventh pitch in the second direction, wherein the sixth pitch is same as the seventh pitch.

7. The semiconductor device of claim 6, wherein the first portion of the second gate isolation film is aligned with the second portion of the second gate isolation film in the first direction.

8. The semiconductor device of claim 1, wherein the second fin-type pattern comprises a first sidewall in contact with the second device isolation film and a second sidewall surrounded by the second gate electrode, the first sidewall connected to the second sidewall, wherein a slope profile of the first sidewall is different from a slope profile of the second sidewall.

9. The semiconductor device of claim 1, wherein the second fin-type pattern is symmetric to the third fin-type pattern with respect to the second device isolation film.

10. The semiconductor device of claim 1, wherein the first gate electrode is disposed immediately adjacent to the second gate electrode.

11. A semiconductor device comprising:

a first fin-type pattern extending in a first direction;

a second fin-type pattern extending in the first direction, the second fin-type pattern spaced apart from the first fin-type pattern by a first pitch in a second direction intersecting the first direction;

a third fin-type pattern extending in the first direction, the third fin-type pattern spaced apart from the second fin-type pattern by a second pitch in the second direction, wherein the second pitch is wider than the first pitch;

a fourth fin-type pattern extending in the first direction, the fourth fin-type pattern spaced apart from the third fin-type pattern by a third pitch in the second direction, wherein the second pitch is wider than the third pitch;

a first device isolation film between the first fin-type pattern and the second fin-type pattern;

a second device isolation film between the second fin-type pattern and the third fin-type pattern;

first and second gate electrodes extending in the second direction on the first to fourth fin-type patterns, the first and second gate electrodes spaced apart from each other in the first direction;

a first gate isolation film comprising a first portion isolating the first gate electrode and a second portion isolating the second gate electrode, the first portion of the first gate isolation film spaced apart from the first fin-type pattern by a fourth pitch in the second direction, the second portion of the first gate isolation film spaced apart from the first fin-type pattern by a fifth pitch in the second direction, wherein the fourth pitch is same as the fifth pitch;

a second gate isolation film spaced apart from the fourth fin-type pattern in the second direction; and a third gate isolation film on the second device isolation film, the third gate isolation film isolating the second gate electrode, wherein the third gate isolation film is not intersected by the first gate electrode, wherein the second gate electrode is divided into two portions between the first and second gate isolation films, wherein a bottom surface of the third gate isolation film is lower than a top surface of the second device isolation film, wherein a bottom surface of the second device isolation film is lower than a bottom surface of the first device isolation film, and wherein the second fin-type pattern comprises a first sidewall in contact with the second device isolation film and a second sidewall surrounded by the second gate electrode, the first sidewall connected to the second sidewall, wherein a slope profile of the first sidewall is different from a slope profile of the second sidewall.

12. The semiconductor device of claim 11, wherein a rising angle of the second fin-type pattern in a direction of the second device isolation film is a first angle, a rising angle of the third fin-type pattern in a direction of the second device isolation film is a second angle, and the first and second angles are acute angles.

13. The semiconductor device of claim 11, wherein the second device isolation film comprises a first material, and wherein each of the first to third gate isolation films comprises a second material different from the first material.

14. The semiconductor device of claim 11, wherein the first portion of the first gate isolation film is aligned with the second portion of the first gate isolation film in the first direction.

15. The semiconductor device of claim 11, wherein the first gate electrode is disposed immediately adjacent to the second gate electrode.

16. A semiconductor device comprising:
a first fin-type pattern extending in a first direction;
a second fin-type pattern extending in the first direction, the second fin-type pattern spaced apart from the first fin-type pattern by a first pitch in a second direction intersecting the first direction;
a third fin-type pattern extending in the first direction, the third fin-type pattern spaced apart from the second fin-type pattern by a second pitch in the second direction, wherein the second pitch is wider than the first pitch;
a fourth fin-type pattern extending in the first direction, the fourth fin-type pattern spaced apart from the third fin-type pattern by a third pitch in the second direction, wherein the second pitch is wider than the third pitch;
a first device isolation film between the first fin-type pattern and the second fin-type pattern;
a second device isolation film between the second fin-type pattern and the third fin-type pattern, the second device isolation film comprising a first material;
first and second gate electrodes extending in the second direction on the first to fourth fin-type patterns, the first and second gate electrodes spaced apart from each other in the first direction;
a first gate isolation film comprising a first portion isolating the first gate electrode and a second portion isolating the second gate electrode, the first portion of the first gate isolation film spaced apart from the first fin-type pattern by a fourth pitch in the second direction, the second portion of the first gate isolation film spaced apart from the first fin-type pattern by a fifth pitch in the second direction, wherein the fourth pitch is same as the fifth pitch;

a second gate isolation film comprising a first portion isolating the first gate electrode and a second portion isolating the second gate electrode, the first portion of the second gate isolation film spaced apart from the fourth fin-type pattern by a sixth pitch in the second direction, the second portion of the second gate isolation film spaced apart from the fourth fin-type pattern by a seventh pitch in the second direction, wherein the sixth pitch is same as the seventh pitch; and a third gate isolation film on the second device isolation film, the third gate isolation film isolating the second gate electrode, wherein the third gate isolation film is not intersected by the first gate electrode, the third gate isolation film comprising a second material different from the first material, wherein the second gate electrode is divided into two portions between the first and second gate isolation films, and wherein a rising angle of the second fin-type pattern in a direction of the second device isolation film is a first angle, a rising angle of the third fin-type pattern in a direction of the second device isolation film is a second angle, wherein the first and second angles are acute angles.

17. The semiconductor device of claim 16, wherein a bottom surface of the third gate isolation film is lower than a top surface of the second device isolation film.

18. The semiconductor device of claim 16, wherein a bottom surface of the second device isolation film is lower than a bottom surface of the first device isolation film.

19. The semiconductor device of claim 16, wherein each of the first and second gate isolation films comprises the second material.

20. The semiconductor device of claim 16, wherein the first portion of the first gate isolation film is aligned with the second portion of the first gate isolation film in the first direction, and
wherein the first portion of the second gate isolation film is aligned with the second portion of the second gate isolation film in the first direction.

* * * * *